United States Patent [19]
Sugiyama

[11] Patent Number: 6,097,634
[45] Date of Patent: Aug. 1, 2000

[54] LATCH-TYPE SENSING CIRCUIT AND PROGRAM-VERIFY CIRCUIT

[75] Inventor: Toshinobu Sugiyama, Kanagawa, Japan

[73] Assignee: Sony Corporation, Tokyo, Japan

[21] Appl. No.: 09/335,033

[22] Filed: Jun. 16, 1999

[30] Foreign Application Priority Data

Jun. 25, 1998 [JP] Japan .................................. P10-178700

[51] Int. Cl.[7] .................................................. G11C 16/06
[52] U.S. Cl. ............................. 365/185.21; 365/185.03; 365/205
[58] Field of Search ......................... 365/185.21, 185.28, 365/205, 207, 208, 185.03; 327/57

[56] References Cited

U.S. PATENT DOCUMENTS 5,299,162   3/1994   Kim et al. ........................ 365/189.01

*Primary Examiner*—Vu A. Le
*Attorney, Agent, or Firm*—Ronald P. Kananen; Rader, Fishman & Grauer

[57] ABSTRACT

A latch-type sensing circuit comprising a first inverter and a second inverter, where at least the first inverter has a variable threshold value of logical inversion. The inverters can have two transistors, where each transistor can have source/drain regions, an channel forming region interposed between the source/drain region, and a floating electrode formed above the channel-forming region through a first insulating layer. There features result in a more simplified circuit configuration.

30 Claims, 23 Drawing Sheets

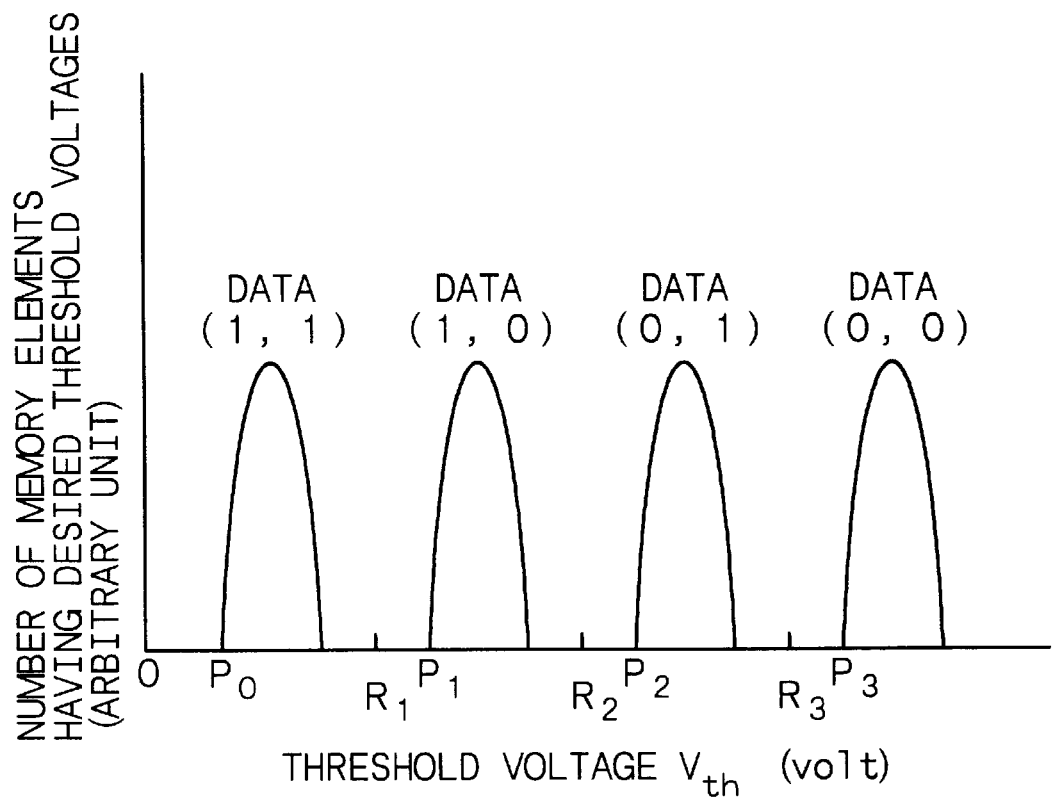

LATCH-TYPE SENSING CIRCUIT AND PROGRAM-VERIFY CIRCUIT

BACKGROUND OF THE INVENTION AND RELATED ART STATEMENT

The present invention relates to a latch-type sensing circuit comprising a combination of two inverters, and a program-verify circuit having the above latch-type sensing circuit.

In recent years, developments have been aggressively made on a memory cell having a floating gate and a control gate and being electrically re-writable (to be simply abbreviated as "memory cell" hereinafter). The memory cell is composed of one memory element or a plurality of memory elements depending upon its type, and these memory cells can be classified, for example, into a type of a NOR type nonvolatile semiconductor memory cell (to be referred to as "NOR type memory cell" hereinafter) and a type of a NAND type nonvolatile semiconductor memory cell (to be referred to as "NAND type memory cell"). Further, with regard to a data readout method and a program-verify method (data writing method), various methods have been and are proposed depending upon types of the memory cells.

A program-verify circuit in a potential sensing-type memory cell has a potential sensing circuit for sensing a potential of a bit line. The potential sensing circuit is composed of a latch-type sensing circuit comprising a combination of two CMOS inverters as shown in FIG. 23. One CMOS inverter comprises a p-channel type MOS transistor $TR_1$ and an n-channel type MOS transistor $TR_2$, and the other CMOS inverter comprises a p-channel type MOS transistor $TR_3$ and an n-channel type MOS transistor $TR_4$. The latch-type sensing circuit has transistors for switching $TR_A$, $TR_B$, $TR_C$ and $TR_D$. The latch-type sensing circuit can convert an analog potential of a bit line to a binary data by comparing a bit line output potential $V_{BL}$ with a reference potential $V_{ref}$, and retain (latch) it therein.

Further, for materializing a large capacity and a lower cost with regard to the memory cell, the technique of multi-bit (multilevel) storage for storing data of 2 bits or more, i.e., a ternary or multi-valued data in one memory element is attracting attention. When the multi-valued data is stored in a memory cell, it is essential to sense a multilevel bit line output potential $V_{BL}$ discriminatingly.

In the conventional latch-type sensing circuit shown in FIG. 23, however, the threshold value of logical inversion of a CMOS inverter is pre-determined depending upon a transistor size and the like given during the designing of the circuit, and is fixed. The threshold value of logical inversion of the CMOS inverter cannot be changed by means of system of a circuit in the memory cell or during the performance of the memory cell. Therefore, for sensing a multilevel bit line output potential $V_{BL}$ discriminatingly, it is required to provide a plurality of latch-type sensing circuits and switch the latch-type sensing circuits depending upon multi-valued date stored in the memory cell, or to provide a plurality of reference potentials $V_{ref}$ and switch the reference potentials $V_{ref}$ depending upon multi-valued date stored in the memory cell. However, the above configuration not only has problems that a circuit layout area of the memory cell increases and that the circuit is complicated, but also involves problems that the performance of the memory cell is complicated itself and a decrease in the performance speed of the memory cell is incurred.

OBJECT AND SUMMARY OF THE INVENTION

It is therefore an object of the present invention to provide a simply constituted latch-type sensing circuit comprising a combination of two inverters and a program-verify circuit which has the above latch-type sensing circuit and is for an electrically re-writable memory cell for storing a multi-valued date.

The latch-type sensing circuit of the present invention for achieving the above object comprises a first inverter and a second inverter, at least the first inverter having a variable threshold value of logical inversion.

The program-verify circuit of the present invention for achieving the above object is a program-verify circuit which is for an electrically re-writable memory cell for storing a ternary or higher multi-valued data, the memory cell comprising a floating gate and a control gate, the program-verify circuit having a latch-type sensing circuit, the latch-type sensing circuit comprising a first inverter and a second inverter, at least the first inverter having a variable threshold value of logical inversion, the latch-type sensing circuit having an input/output terminal connected to the memory cell through a bit line. The memory cell includes a NOR type nonvolatile semiconductor memory cell and a NAND type nonvolatile semiconductor memory cell.

In the latch-type sensing circuit or the program-verify circuit of the present invention, the first inverter may have a configuration in which it has an input portion (to be sometimes referred to as "first input portion" for convenience hereinafter), which is for receiving a reference potential and is connected to an output portion of the second inverter, and an input portion (to be sometimes referred to as "second input portion" for convenience hereinafter), which is for receiving a potential for controlling a threshold value of logical inversion of the first inverter, and an output portion of the first inverter corresponds to the input/output terminal of the latch-type sensing circuit and is connected to an input portion of the second inverter. The above constituted latch-type sensing circuit or program-verify circuit will be sometimes referred to as latch-type sensing circuit or program-verify circuit according to a first aspect of the present invention.

In the latch-type sensing circuit or the program-verify circuit of the present invention, the first inverter may have a configuration in which it has an input portion (to be sometimes referred to as "first input portion" for convenience hereinafter), which corresponds to the input/output terminal of the latch-type sensing circuit and is connected to an output portion of the second inverter, and an input portion (to be sometimes referred to as "second input portion" for convenience hereinafter), which is for receiving a potential for controlling a threshold value of logical inversion of the first inverter, and the second inverter has an input portion which is for receiving a reference potential and is connected to an output portion of the first inverter. The above-constituted latch-type sensing circuit or program-verify circuit will be sometimes referred to as latch-type sensing circuit or program-verify circuit according to a second aspect of the present invention.

In the latch-type sensing circuit or the program-verify circuit according to the first or second aspect of the present invention, the first inverter comprises a first transistor and a second transistor having a conductivity type opposite to a conductivity of the first transistor, each of the first transistor and the second transistor is composed of (A) source/drain regions, (B) a channel-forming region interposed between the source/drain regions and (C) a floating electrode formed above the channel-forming region through a first insulating layer, the first inverter has a plurality of input gate electrodes formed above the floating electrode through a second insulating layer, the floating electrode of the first transistor and the floating electrode of the second transistor are of one common floating electrode, one input gate electrode corresponds to the above first input portion, and the other input gate electrode corresponds to the above second input portion. The term "the other input gate electrode" in the specification and the claims includes not only "the other input gate electrode" but also "the other input gate electrodes". A combination of the first transistor and the second transistor constituting the above first inverter is also called a neuron CMOS transistor.

In the latch-type sensing circuit or the program-verify circuit according to the first or second aspect of the present invention, further, the second inverter may have a configuration in which the second inverter has a fixed threshold value of logical inversion and comprises a third transistor and a fourth transistor having a conductivity type opposite to a conductivity type of the third transistor, each of the third transistor and the fourth transistor is composed of (A) source/drain regions, (B) a channel-forming region interposed between the source/drain regions and (C) a floating electrode formed above the channel-forming region through a first insulating layer, the second inverter further has a plurality of input gate electrodes formed above the floating electrode through a second insulating layer, the floating electrode of the third transistor and the floating electrode of the fourth transistor are of one common floating electrode, a plurality of the input gate electrodes are common, and the common input gate electrode corresponds to the input portion of the second inverter. Alternatively, the second inverter may have a configuration in which the second inverter has a fixed threshold value of logical inversion and comprises CMOSs. Otherwise, in the latch-type sensing circuit or the program-verify circuit according to the first aspect of the present invention, the second inverter may have a configuration in which the second inverter has a variable threshold value of logical inversion and comprises a third transistor and a fourth transistor having a conductivity type opposite to a conductivity type of the third transistor, each of the third transistor and the fourth transistor is composed of (A) source/drain regions, (B) a channel-forming region interposed between the source/drain regions and (C) a floating electrode formed above the channel-forming region through a first insulating layer, the second inverter further has a plurality of input gate electrodes formed above the floating electrode through a second insulating layer, the floating electrode of the third transistor and the floating electrode of the fourth transistor are of one common floating electrode, one input gate electrode corresponds to the input portion of the second inverter, and a potential for controlling the threshold value of logical inversion of the second inverter is applied to the other input gate electrode.

The program-verify circuit according to the first or second aspect of the present invention may further have a configuration in which a digital/analog converter is provided and the digital/analog converter outputs a potential for controlling the threshold value of logical inversion of the first inverter. In this case, the digital/analog converter may have a configuration in which it comprises a variable threshold voltage field-effect transistor, the variable threshold voltage field-effect transistor is composed of (a) source/drain regions, (b) a channel-forming region interposed between the source/drain regions, (c) one floating electrode formed above the channel-forming region through a first insulating layer and (d) a plurality of input gate electrodes which are formed above the floating electrode through a second insulating layer and for receiving signals corresponding to multi-valued data to be stored, and one of the source/drain regions outputs the potential for controlling the threshold value of logical inversion of the first inverter.

Further, preferably, the program-verify circuit according to the first or second aspect of the present invention has a configuration in which it further has a read circuit comprising an analog/digital converter and the above digital/analog converter composed of a variable threshold voltage field-effect transistor, an input portion of the analog/digital converter is connected to the bit line, each output portion of the analog/digital converter is connected to each input gate electrode of the variable threshold voltage field-effect transistor constituting the digital/analog converter, and one of the source/drain regions of the variable threshold voltage field-effect transistor constituting the digital/analog converter is also connected to the input portion of the analog/digital converter. In this case, the program-verify circuit can have a configuration in which the digital/analog converter constituted of the variable threshold voltage field-effect transistor has two input gate electrodes, the analog/digital converter comprises a variable threshold voltage inverter having two input portions and one output portion and third, fourth and fifth inverters comprising CMOS inverters each, one input portion of the variable threshold voltage inverter and an input portion of the third inverter are connected to the bit line, an output portion of the third inverter is connected to the other input portion of the variable threshold voltage inverter and an input portion of the fifth inverter, an output portion of the variable threshold voltage inverter is connected to an input portion of the fourth inverter, and output portions of the fourth inverter and the fifth inverter are connected to two input gate electrodes of the above digital/analog converter. The variable threshold voltage inverter is preferably composed of a neuron CMOS transistor comprising a combination of a p-channel type transistor and an n-channel type transistor.

In the present invention, since the latch-type sensing circuit or the program-verify circuit has an inverter having a variable threshold value of logical inversion, a reference potential can be apparently changed when a potential to be inputted into the latch-type sensing circuit and the reference potential are compared, and as a result, the circuit configuration can be simplified.

BRIEF DESCRIPTION OF THE DRAWINGS

The present invention will be explained in detail with reference to drawings hereinafter.

FIG. 19 schematically shows a distribution of memory elements with regard to reference points ($P_0$, $P_1$, $P_2$, $P_3$) and reference voltages ($R_1$, $R_2$, $R_3$) when 2 bits are stored in one memory element.

DESCRIPTION OF THE PREFERRED EMBODIMENTS

EXAMPLE 1

Figure 1A:
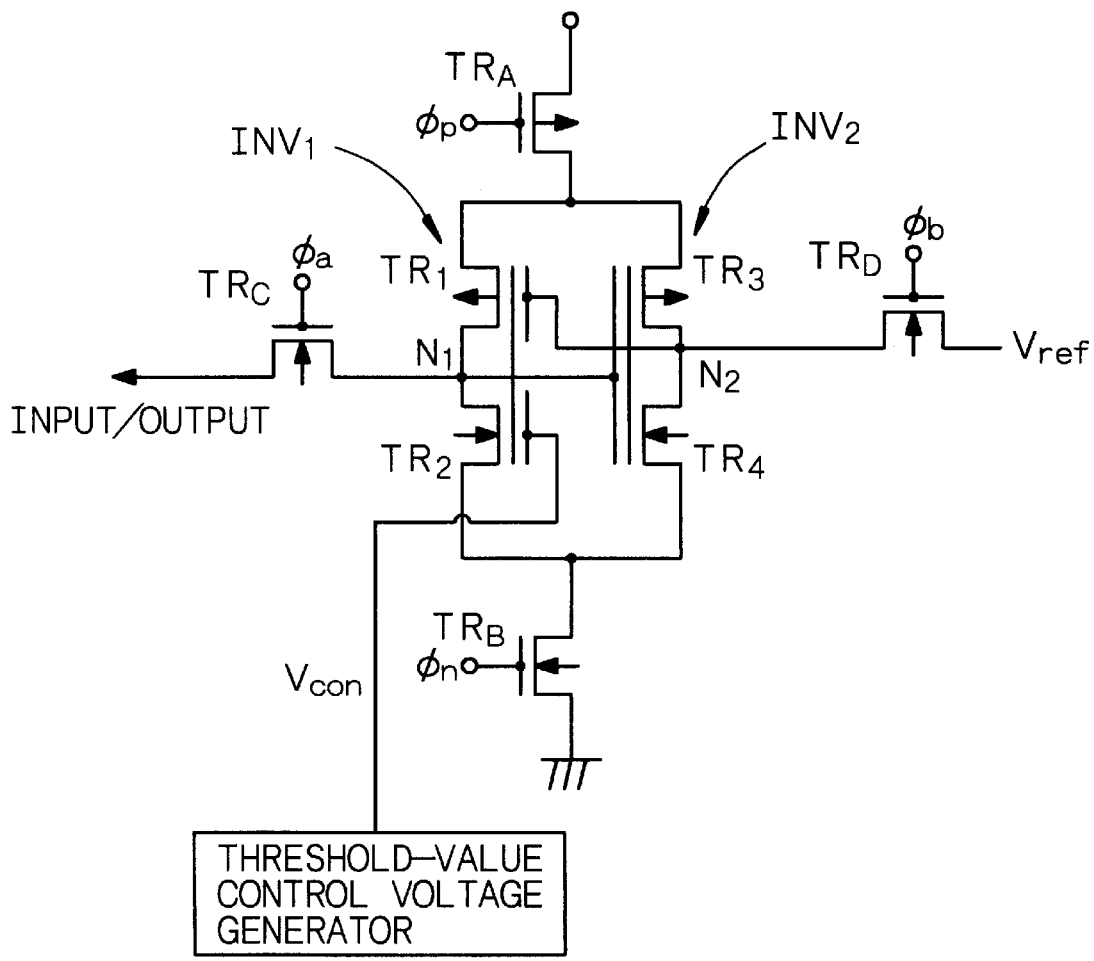
FIG. 1A shows a circuit diagram of a latch-type sensing circuit in Example 1.
Figure 1B:
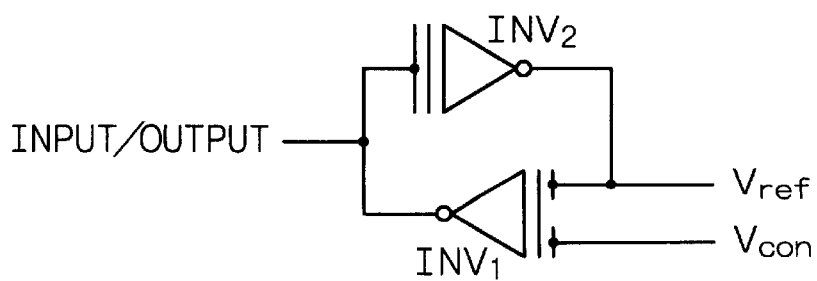
FIG. 1B shows an equivalent circuit diagram thereof.

Example 1 relates to a latch-type sensing circuit according to the first aspect of the present invention. FIG. 1A shows a circuit diagram of the latch-type sensing circuit, and FIG. 1B shows an equivalent circuit diagram thereof. The latch-type sensing circuit in Example 1 comprises a first inverter $INV_1$ and a second inverter $INV_2$, and the first inverter $INV_1$ has a variable threshold value of logical inversion. In Example 1, the first inverter $INV_1$ has an input portion (first input portion) which is for receiving a reference potential $V_{ref}$ and is connected to an output portion of the second inverter $INV_2$, and an input portion (second input portion) which is for receiving a potential (threshold-value control voltage) $V_{con}$ for controlling the threshold value of logical inversion of the first inverter $INV_1$. An output portion of the first inverter $INV_1$ corresponds to an input/output terminal of the latch-type sensing circuit and is connected to an input portion of the second inverter $INV_2$. A threshold-value control voltage generator for generating a threshold-value control voltage $V_{con}$ may be composed, for example, of a conventional a digital/analog converter (to be referred to as "D/A converter" hereinafter) or it may be composed of a D/A converter to be explained in Example 2.

Figure 3A:
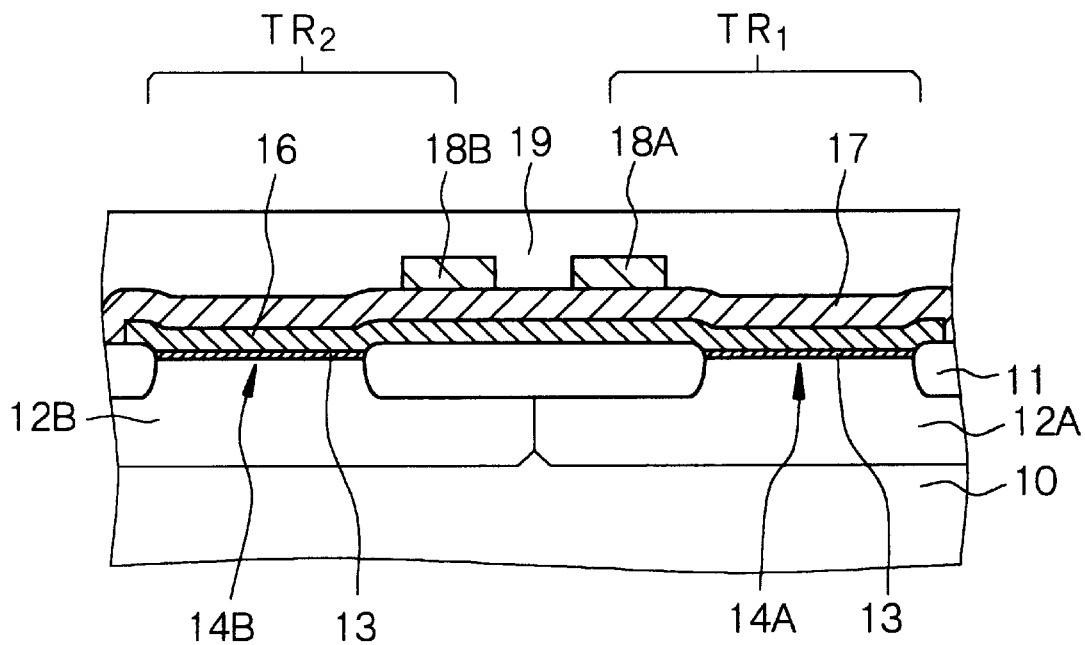
FIG. 3A is a schematic cross-sectional view of a first transistor and a second transistor constituting the first inverter.
Figure 3B:
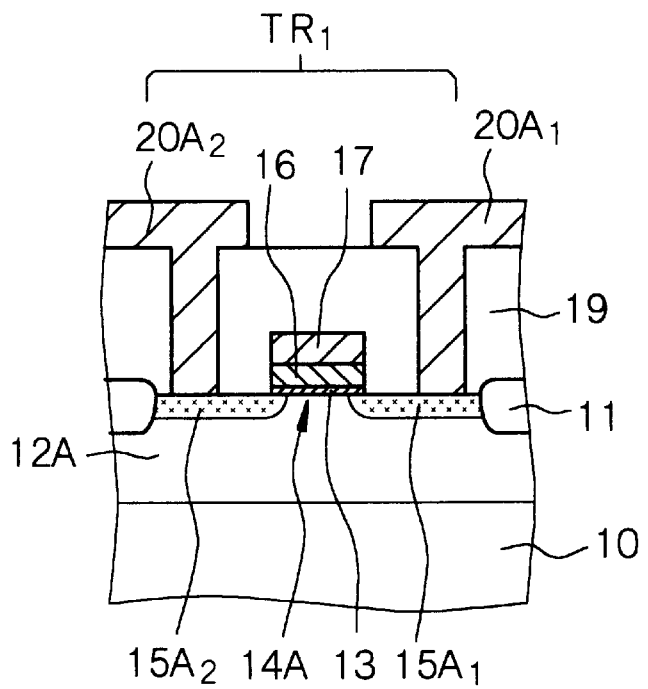
FIG. 3B is a schematic cross-sectional view of the first transistor being taken from a cross section different from the cross section shown in FIG. 3A.
Figure 4:
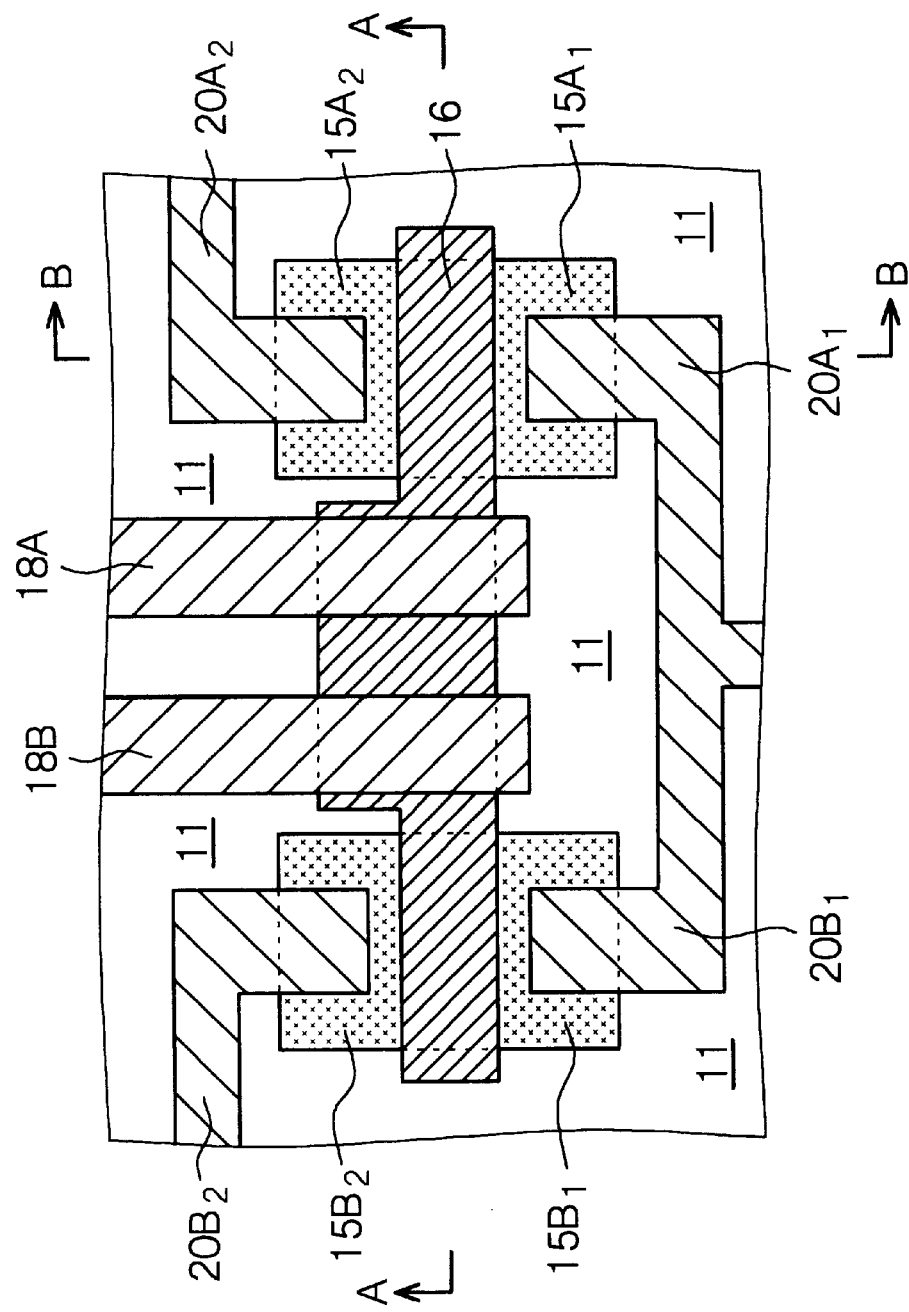
FIG. 4 is a schematic layout of the first inverter and elements of the first transistor and the second transistor constituting the first inverter.

Specifically, the first inverter $INV_1$ comprises a p-channel type first transistor $TR_1$ and an n-channel type second transistor $TR_2$ having a conductivity type opposite to a conductivity type of the first transistor $TR_1$. FIG. 3A shows a schematic cross-sectional view of the first transistor $TR_1$ and the second transistor $TR_2$. FIG. 3B shows a schematic cross-sectional view of the first transistor $TR_1$. FIG. 4 shows a schematic layout of elements constituting the first inverter $INV_1$, the first transistor $TR_1$ and the second transistor $TR_2$. FIG. 3A is a schematic cross-sectional view taken along arrow A—A in FIG. 4, and FIG. 3B is a schematic cross-sectional view taken along arrow B—B in FIG. 4.

The p-channel type first transistor $TR_1$ is composed of source/drain regions (drain region $15A_1$ and source region $15A_2$) formed in an n-type well 12A formed in an n-type silicon semiconductor substrate 10, a channel-forming region 14A interposed between the source/drain regions $15A_1$ and $15A_2$, and the floating electrode 16 formed above the channel-forming region 14A through a first insulating layer (gate insulating layer) 13. As shown in a partial cross-sectional view of FIG. 3A, the n-channel type second transistor $TR_2$ is composed of source/drain regions (drain region $15B_1$ and source region $15B_2$) formed in a p-well 12B formed in the n-type silicon semiconductor substrate 10, a channel-forming region 14B interposed between the source/drain regions $15B_1$ and $15B_2$, and a floating electrode 16 formed above the channel-forming region 14B through the first insulating layer (gate insulating layer) 13. The first inverter $INV_1$ further has an input gate electrode 18A (corresponding to one input gate electrode) and an input gate electrode 18B (corresponding to the other input gate electrode) formed above the floating electrode 16 through a second insulating layer 17. The first transistor $TR_1$ and the second transistor $TR_2$ are separated from each other by an isolation region 11. Reference numeral 19 indicates a dielectric interlayer, and reference numerals $20A_1$, $20A_2$, $20B_1$ and $20B_2$ indicate wirings. The second transistor $TR_2$ has the same structure as that of the first transistor $TR_1$ shown in FIG. 3B. The so-structured transistor is also called a neuron CMOS transistor. For the neuron CMOS transistor, see, for example, JP-A-7-200513.

The floating electrode 16 of the first transistor $TR_1$ and the floating electrode 16 of the second transistor $TR_2$ are of one common floating electrode. That is, they are common and formed integrally or continuously so as to be combined. The input gate electrode 18A corresponds to the first input portion, and the input gate electrode 18B corresponds to the second input portion. There may be employed a configuration in which the input gate electrode 18A corresponds to the second input portion and the input gate electrode 18B corresponds to the first input portion.

The second inverter $INV_2$ has a fixed threshold value of logical inversion, and comprises a p-channel type third transistor $TR_3$ and an n-channel type fourth transistor $TR_4$ having a conductivity type opposite to a conductivity type of the third transistor $TR_3$. The third transistor $TR_3$ and the fourth transistor $TR_4$ have configurations which are substantially the same as those of the first transistor $TR_1$ and the second transistor $TR_2$ whose schematic cross-sectional views are shown in FIGS. 3A and 3B except that an input gate electrode 18A and an input gate electrode 18B are common. Specifically, the input gate electrode 18A and the input gate electrode 18B may be connected to each other with a wiring or they are common and integrally or continuously formed so as to be combined. The common input gate electrode corresponds to the input portion of the second inverter $INV_2$.

The source region $15A_2$ of the first transistor $TR_1$ and the source region $15A_2$ of the third transistor $TR_3$ are connected to a transistor for switching $TR_A$. Further, the source region $15B_2$ of the second transistor $TR_2$ and the source region $15B_2$ of the fourth transistor $TR_4$ are connected to a transistor for switching $TR_B$. Activation signals $\phi_P$ and $\phi_n$ for activating the latch-type sensing circuit are inputted to these transistors for switching $TR_A$ and $TR_B$. Further, the output portion of the second inverter $INV_2$ is connected to generating means (not shown) for generating a reference potential $V_{ref}$ through a transistor for switching $TR_D$. The output portion of the first inverter $INV_1$ (drain regions $15A_1$ and $15B_1$ of the first and second transistors $TR_1$ and $TR_2$) corresponding to the input/output terminal of the latch-type sensing circuit is connected to a transistor for switching $TR_C$. The transistors for switching $TR_C$ and $TR_D$ are provided for controlling the connection of the latch-type sensing circuit with the generating means for generating the reference potential $V_{ref}$ and the connection of the latch-type sensing circuit with an external circuit.

Figure 2A:
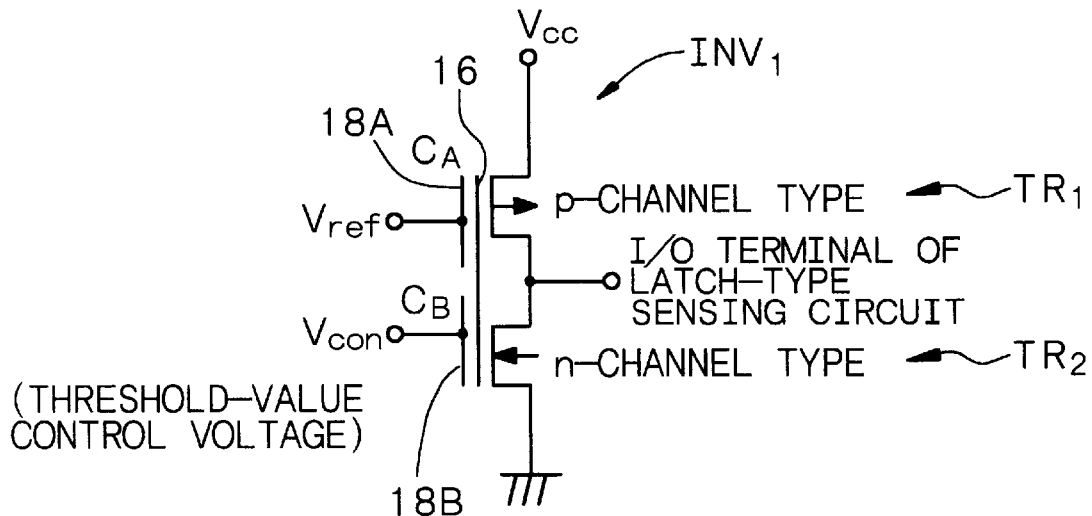
FIG. 2A is a circuit diagram of a first inverter.
Figure 2B:
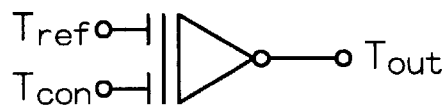
FIG. 2B is a skeleton diagram of the first inverter.

The first inverter $INV_1$ having two input portions and being constituted of a neuron CMOS transistor shown in FIG. 2A will be outlined below. The first inverter $INV_1$ is constituted of a neuron CMOS transistor which comprises a combination of the p-channel type first transistor $TR_1$ and the n-channel type second transistor $TR_2$ and has the floating electrode 16 in common as shown in FIGS. 3A and 3B. The reference potential $V_{ref}$ is inputted to the input gate electrode 18A corresponding to the first input portion $T_{ref}$ of the first inverter $INV_1$. A threshold-value control voltage $V_{con}$ is inputted to the input gate electrode (threshold-voltage control gate electrode) 18B corresponding to the second input portion $T_{con}$ of the first inverter $INV_1$. There may be employed a configuration in which the input gate electrode 18A is used as "the other" input gate electrode, the input gate electrode 18B is used as "one" input gate electrode, the threshold-value control voltage $V_{con}$ is inputted to the input gate electrode 18A, and the reference potential $V_{ref}$ is inputted to the input gate electrode 18B. In other Examples, exchanging "one" input gate electrode and "the other" input gate electrode gives an equivalent result. FIG. 2B shows a skeleton diagram of the first inverter $INV_1$.

The potential $\Phi_{F1}$ of the floating electrode 16 is given by the following expression (1), $$\Phi_{F1}=(C_A V_{ref}+C_B V_{con})/C_{TOTAL} \qquad (1)$$

wherein $C_A$ is a coupling capacitance between the floating electrode 16, which is common to the first transistor $TR_1$ and the second transistor $TR_2$, and the input gate electrode 18A, $C_B$ is a coupling capacitance between the floating electrode 16 and the input gate electrode 18B, $C_0$ is a coupling capacitance between the floating electrode 16 and the silicon semiconductor substrate 10, $C_{TOTAL}=(C_0+C_A+C_B)$, and $V_{ref}$ and $V_{con}$ are the potentials inputted to the input gate electrodes 18A and 18B, provide that the silicon semiconductor substrate 10 has a potential of 0 volt.

The transistors for switching $TR_A$, $TR_B$, $TR_C$ and $TR_{Da}$ are turned off, the latch-type sensing circuit is brought into a floating state, and then the transistors for switching $TR_C$ and $TR_D$ are turned on. It is supposed that an input potential $V_{in}$ is applied to the input/output terminal of the latch-type sensing circuit. That is, in FIG. 1A, the node $N_1$ has a potential of $V_{in}$ and the node $N_2$ has a potential of $V_{ref}$. Then, an activation signal $\phi_n$ for activating the latch-type sensing circuit is inputted to the transistor for switching $TR_B$. Then, an activation signal $\phi_P$ is inputted to the transistor for switching $TR_A$.

In a conventional CMOS inverter comprising a combination of a p-channel type MOS transistor and an n-channel type MOS transistor, the threshold value of logical inversion of the CMOS inverter is determined on production of the transistors, and is fixed. On the other hand, an "H" state or "L" state retained in the latch-type sensing circuit in Example 1, i.e., the threshold value of logical inversion of the first inverter $INV_1$ of the latch-type sensing circuit depends upon $\Phi_{F1}$. Further, $\Phi_{F1}$ is dependent upon $V_{con}$ as is clear from the expression (1). That is, the higher the threshold-value control voltage $V_{con}$ is, the higher the input potential $V_{in}$ at which the inversion of logic of the first inverter $INV_1$ takes place is. As described above, by changing the threshold-value control voltage $V_{con}$ to be inputted to the threshold-voltage control gate electrode in the first inverter $INV_1$, the threshold value of logical inversion of the first inverter $INV_1$ can be set at an arbitrary voltage.

Figure 2C:
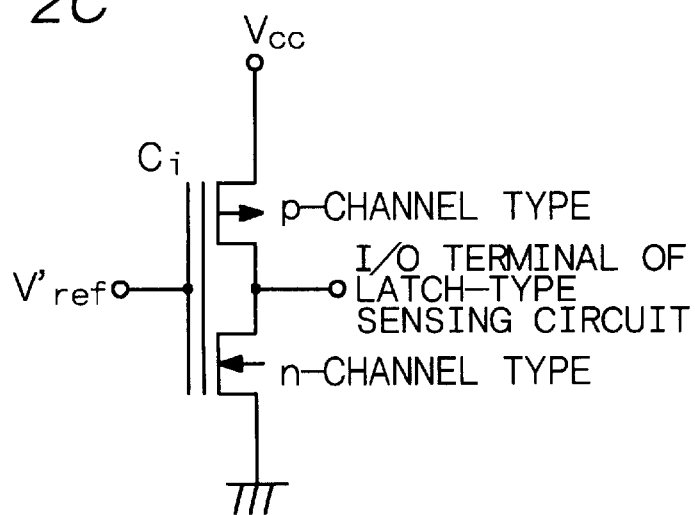
FIG. 2C is an equivalent circuit diagram of the first inverter.

As described above, regarded from the input/output terminal of the latch-type sensing circuit, it can appear that a change takes place in the reference potential $V_{ref}$. That is, an apparent reference potential $V'_{ref}$ can be changed. As FIG. 2C shows an equivalent circuit diagram, it is assumed that the input gate electrodes of the first inverter $INV_1$ are arranged to be one and that the apparent reference potential $V'_{ref}$ is applied to the above input gate electrode. The coupling capacitance between the floating electrode and the input gate electrode is taken as $C_i$, and it is assumed that $C_i$ has a value nearly equal to a value of $(C_A+C_B)$. Then, the relationship between the apparent reference potential $V'_{ref}$ and $\Phi_{F1}$ satisfies the following expression (2). Further, the following expression (3) can be obtained from the expressions (2) and (1).

$$\Phi_{F1}=C_i V'_{ref}/C_{TOTAL}$$

$$\approx (C_A+C_B)V'_{ref}/C_{TOTAL} \qquad (2)$$

$$V'_{ref} \approx (C_A V_{ref}+C_B V_{con})/(C_A+C_B) \qquad (3)$$

As is also clear from the expression (3), therefore, the potential $V_{in}$ in the input/output terminal of the latch-type sensing circuit can be compared with the apparent reference potential $V'_{ref}$ in the latch-type sensing circuit with changing the threshold-value control voltage $V_{con}$, an analog potential in the input/output terminal of the latch-type sensing circuit can be converted to binary data, and the binary data can be retained (latched) in the latch-type sensing circuit. That is, when the potential $V_{in}$ in the input/output terminal of the latch-type sensing circuit is higher than the apparent reference potential $V'_{ref}$, an "H" state of the latch-type sensing circuit is retained. When the potential $V_{in}$ in the input/output terminal of the latch-type sensing circuit is lower than the apparent reference potential V'$_{ref}$ an "L" state of the latch-type sensing circuit is retained. As explained above, the latch-type sensing circuit of the present invention obviates a plurality of latch-type sensing circuits or a plurality of reference potentials. More specific performances of the latch-type sensing circuit in Example 1 will be explained in the following Example 2.

EXAMPLE 2

Figure 5:
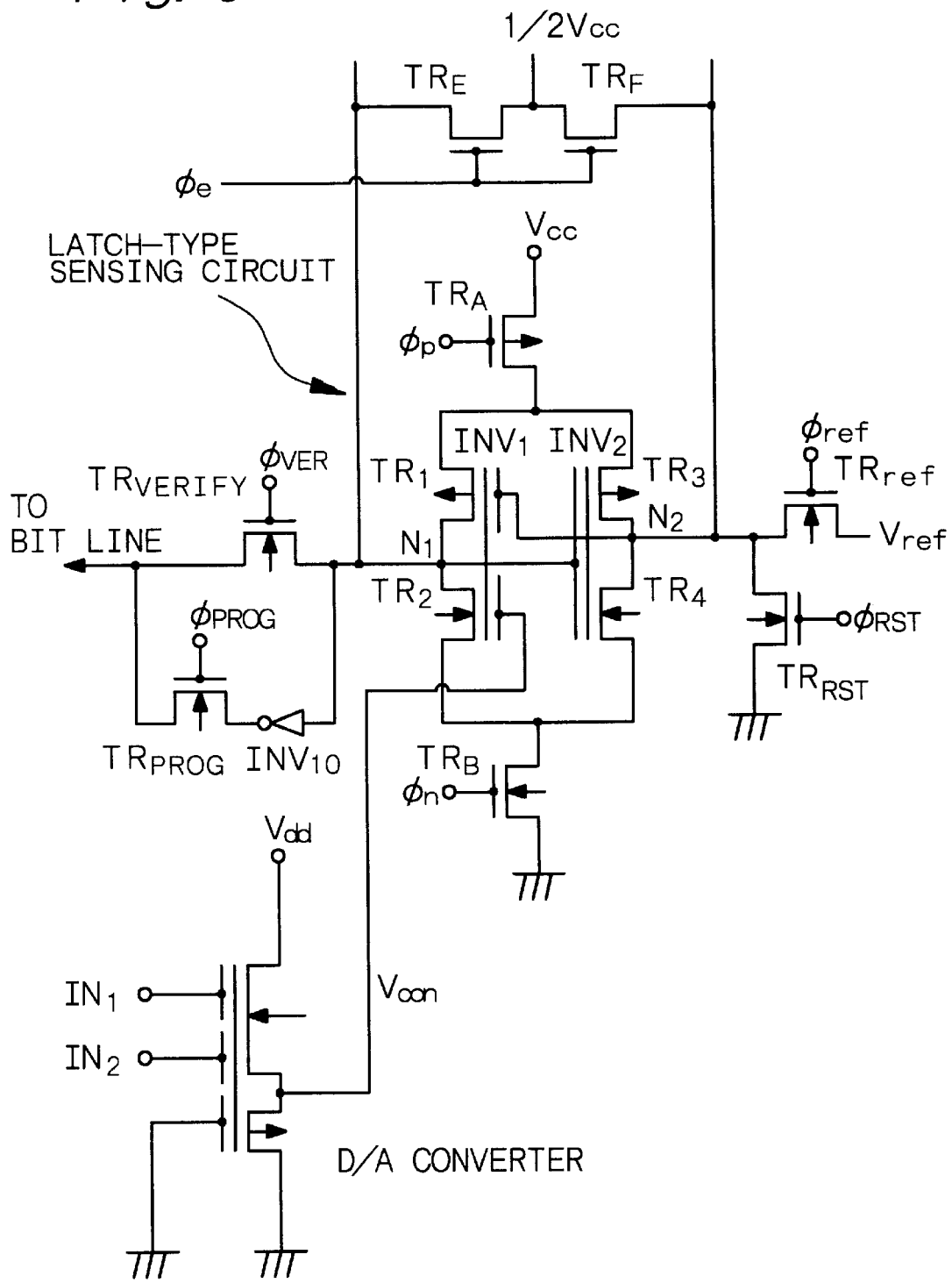
FIG. 5 is a circuit diagram of a program-verify circuit in Example 2.

Example 2 relates to a program-verify circuit according to the first aspect of the present invention. As FIG. 5 shows a circuit diagram of the program-verify circuit, the latch-type sensing circuit according to the first aspect of the present invention, shown in FIGS. 1A and 1B, is incorporated into the program-verify circuit. In Example 2, an electrically re-writable memory cell which has a floating gate (also called "floating electrode" or "charge storage electrode") and a control gate (also called "control electrode") and is for storing ternary or higher multi-valued data is a NAND type memory cell. The input/output terminal of the latch-type sensing circuit is connected to the memory cell through a transistor for programming TR$_{PROG}$ or a transistor for verification TR$_{VERIFY}$ and through a bit line. In the program-verify circuit in Example 2, further, an inverter INV$_{10}$ is provided between the input/output terminal of the latch-type sensing circuit and the transistor for programming TR$_{PROG}$. Further, a reset transistor TR$_{RST}$ is connected to the input portion of the first inverter INV$_1$ constituting the latch-type sensing circuit, which input portion is also the output portion of the second inverter INV$_2$.

Figure 7:
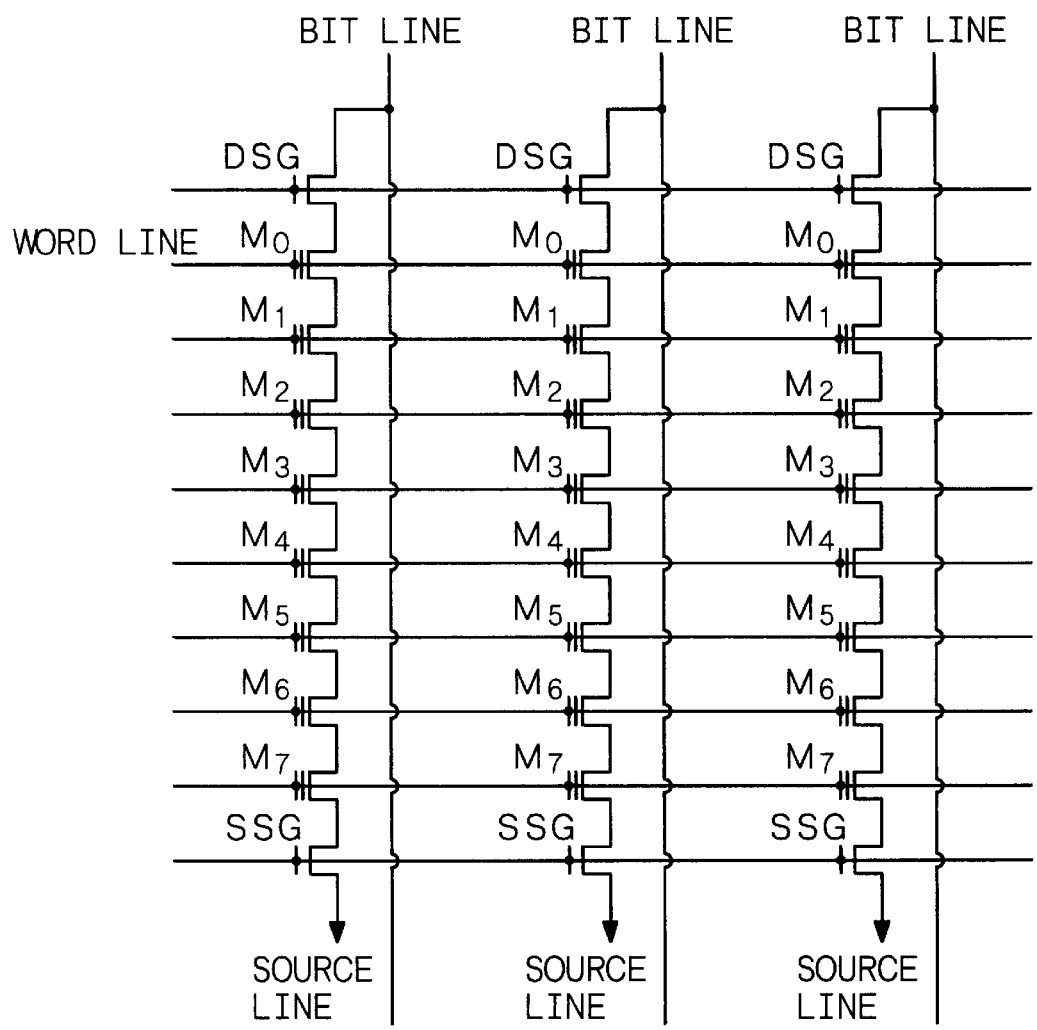
FIG. 7 shows a cell array configuration of a NAND type memory cell.
Figure 8:
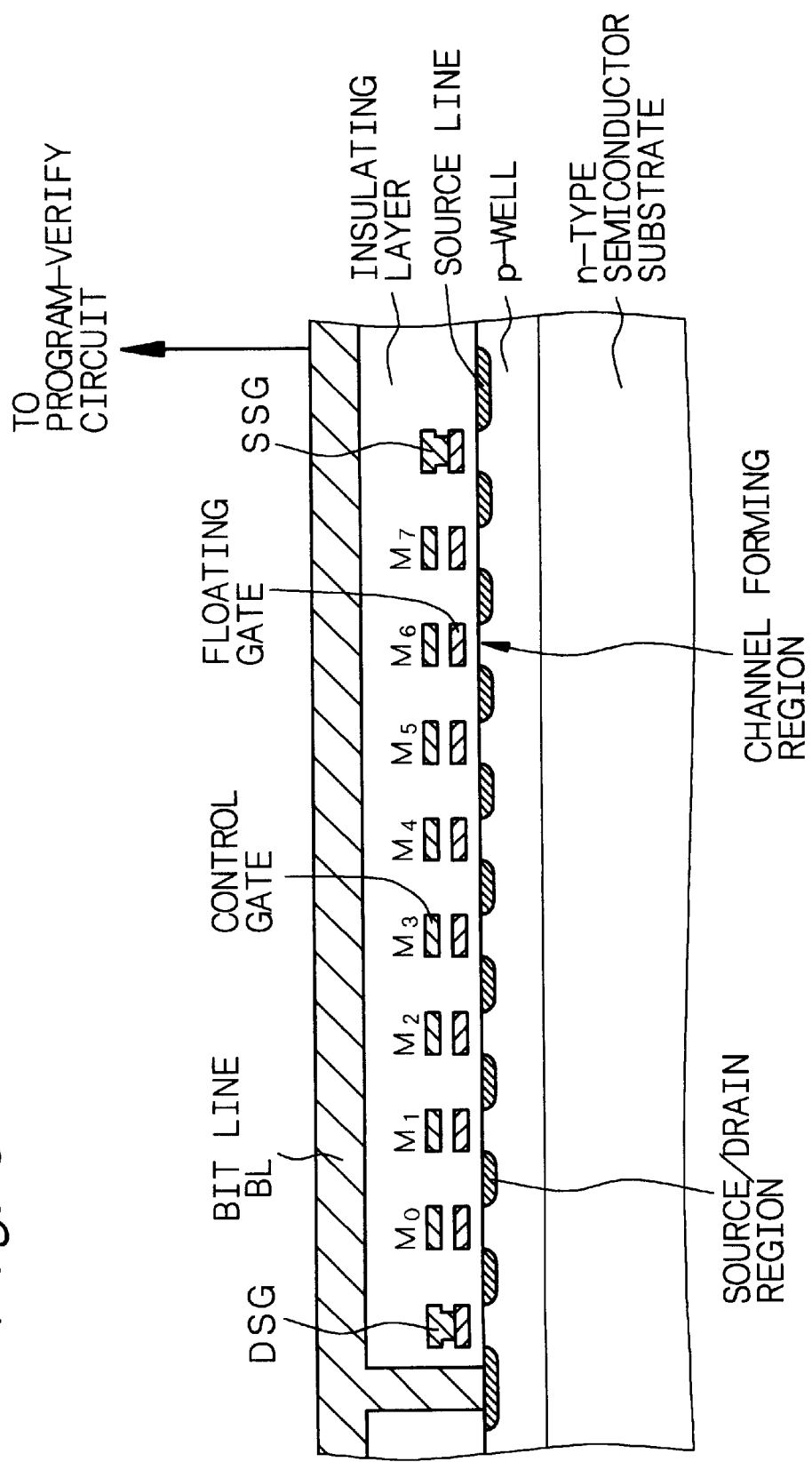
FIG. 8 is a schematic cross-sectional view of memory elements constituting the NAND type memory cell.

As FIG. 7 shows a cell-array structure and as FIG. 8 shows a schematic partial cross-sectional view, the NAND type memory cell comprises a plurality of memory elements M$_0$–M$_7$, and each of the memory elements M$_0$–M$_7$, constituting the NAND type memory cell is formed, for example, in a p-type well and is composed of source/drain regions, a channel-forming region, a floating gate and a control gate. In the NAND type memory cell, one of the source/drain regions of one memory element is common to the other of the source/drain regions of another adjacent memory element, whereby a plurality of the memory elements are connected in series. Further, the memory element positioned in one end of the NAND type memory cell is connected to the bit line BL through a first selection transistor DSG. The memory element positioned in the other end of the NAND type memory cell is connected to a common source line through a second selection transistor SSG. A plurality of the NAND type memory cells are arranged in a direction of a column, and the control gates are connected to word lines arranged in a direction of a row.

The performance of writing data in the memory element in the NAND type memory cell will be outlined below.

In the NAND type memory cell, writing of data starts at the memory element M$_7$ positioned farthest from the bit line BL. In a program cycle, a high potential (for example, 20 volts) is applied to a selected word line, to apply a high potential (for example, 20 volts) to a control gate of a memory element in which data is to be written (to be referred to as "selected memory element" for convenience hereinafter). An intermediate potential (for example, 10 volts) is applied to the control gates of the memory elements (to be referred as "non-selected memory elements" for convenience hereinafter) different from the selected memory element. On the other hand, for example, 0 volt is applied to the bit line BL. Then, the first selection transistor DSG is turned on, and the second selection transistor SSG is turned off, whereby a potential in the bit line BL is transferred to the source/drain regions of the memory elements. In the selected memory element, electrons are injected from the channel-forming region to the floating gate due to a Fowler-Nordheim-tunneling on the basis of a potential difference between the control gate and the channel-forming region. As a result, a threshold voltage of the selected memory element shifts from negativity in the beginning toward a positive direction, and data is written in the selected memory element. In each non-selected memory element, no large potential difference arises between the control gate and the channel-forming region, and electrons are not injected from the channel-forming region to the floating gate. As a result, a threshold voltage of each non-selected memory element has no change from its initial value, and initial data is retained in each non-selected memory element. Multi-valued data can be stored in the memory element by applying a high potential (for example, 20 volts) to the control gate in the form of a pulse so as to increase the threshold voltage V$_{th}$ of the memory element up to a predetermined value.

In a verify cycle, it is evaluated in the same manner as in the readout performance whether or not the threshold voltages V$_{th}$ of the memory elements M$_0$–M$_7$ have predetermined values. Specifically, the potential of the bit line BL is re-setted, for example, at 0 volt, to allow the bit line BL to be in a floating state. Then, a predetermined voltage is applied to a common source line, to charge the bit line BL through the memory elements. Potentials to be applied to the gate electrode of the first selection transistor DSG, the gate electrode of the second selection transistor SSG and the control gate of each memory element are controlled such that the potential of the charged bit line BL is determined by the threshold voltage V$_{th}$ of the selected memory element. More specifically, the configuration of the memory cell is pre-designed such that the bit line BL has a potential equal to a value (V$_{select}$–V$_{th}$) obtained by deducting the threshold voltage V$_{th}$ of the selected memory element from a potential V$_{select}$ applied to the control gate of the selected memory element. When the threshold voltage V$_{th}$ of the memory element reaches a predetermined value, the writing performance is finished. When the threshold voltage V$_{th}$ of the memory element does has not reached the predetermined value, the program cycle is again carried out. As described above, the program cycle and the verify cycle are repeated, whereby the value of the threshold voltage V$_{th}$ of the memory element increases as the number of voltage pulses applied to the control gate increases, and finally, the threshold voltage V$_{th}$ of the memory element reaches the predetermined value.

Figure 9A:
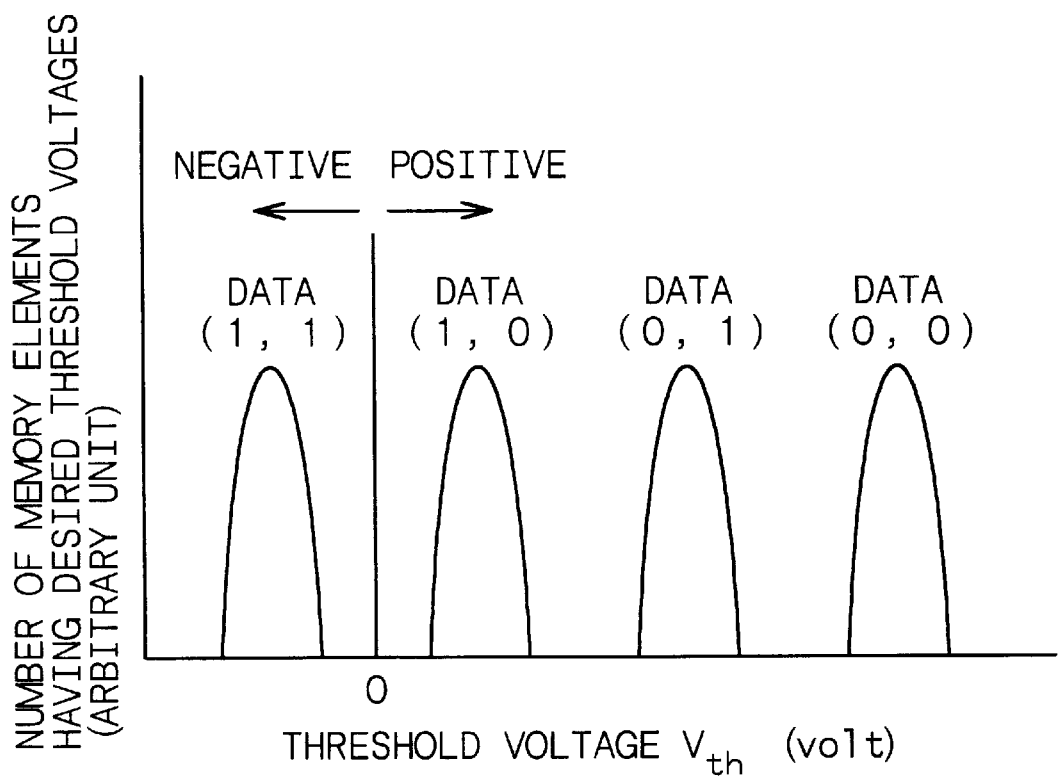
FIG. 9A schematically shows a distribution of threshold voltages $V_{th}$ of memory elements of the NAND type memory cells, and FIG. 9B schematically shows a distribution of bit line output potentials $V_{BL}$ outputted to a bit line.
Figure 9B:
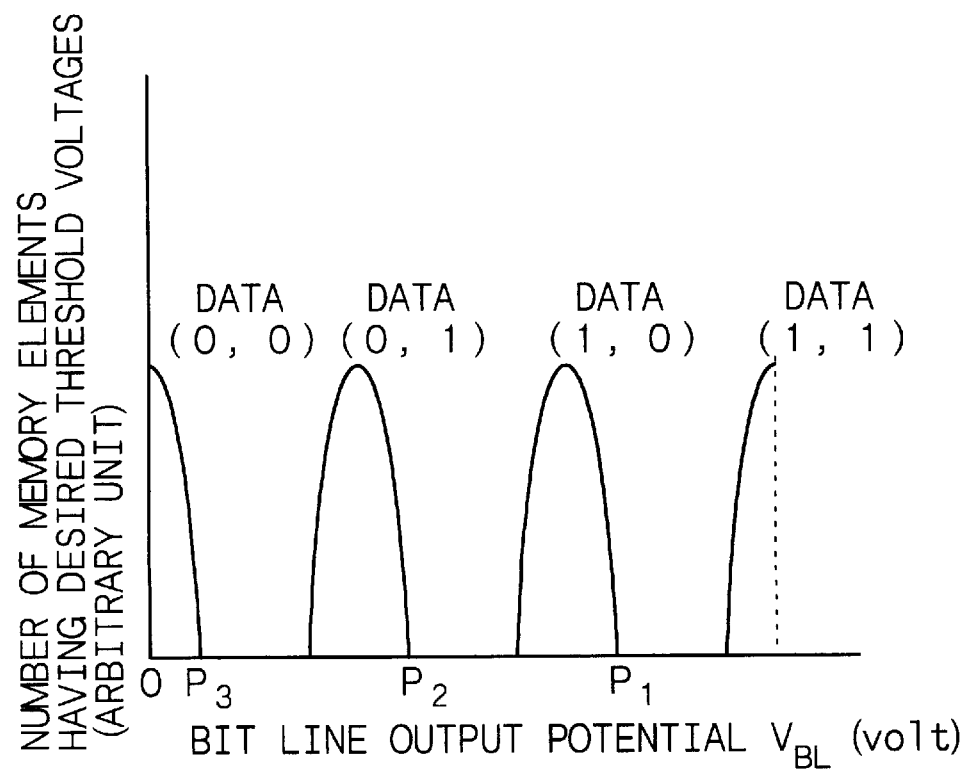

FIG. 9A shows a distribution of the threshold voltages V$_{th}$ of the memory elements. In the NAND type memory cell, the threshold voltage V$_{th-11}$ of the memory element storing data (1,1), that is, a data-erased state has a distribution in negative potentials, and the threshold voltages V$_{th-10}$, V$_{th-01}$ and V$_{th-00}$ of the memory elements storing data (1,0), data (0,1) and data (0,0) respectively have distributions in positive potentials. Further, the above threshold voltages have a relationship of V$_{th-10}$<V$_{th-01}$<V$_{th-00}$. FIG. 9B shows a distribution of bit line output potentials V$_{BL}$ outputted to the bit line BL in the verify cycle. Table 1 shows a relationship between data stored in the memory element and the bit line output potential V$_{BL}$, and a relationship of V$_{BL-00}$<V$_{BL-01}$<V$_{BL-10}$<V$_{BL-11}$ is satisfied. For example, the value of V$_{BL-11}$ equals (V$_{select}$–V$_{th-11}$). The upper limit values of V$_{BL-00}$, V$_{BL-01}$ and $_{BL-10}$ are P$_3$, P$_2$ and P$_1$, respectively.

TABLE 1

| Data stored | Bit line output potential $V_{BL}$ |
|---|---|
| (1,1) | $V_{BL-11}$ |
| (1,0) | $V_{BL-10}$ (upper limit value: $P_1$) |
| (0,1) | $V_{BL-01}$ (upper limit value: $P_2$) |
| (0,0) | $V_{BL-00}$ (upper limit value: $P_3$) |

Figure 10A:
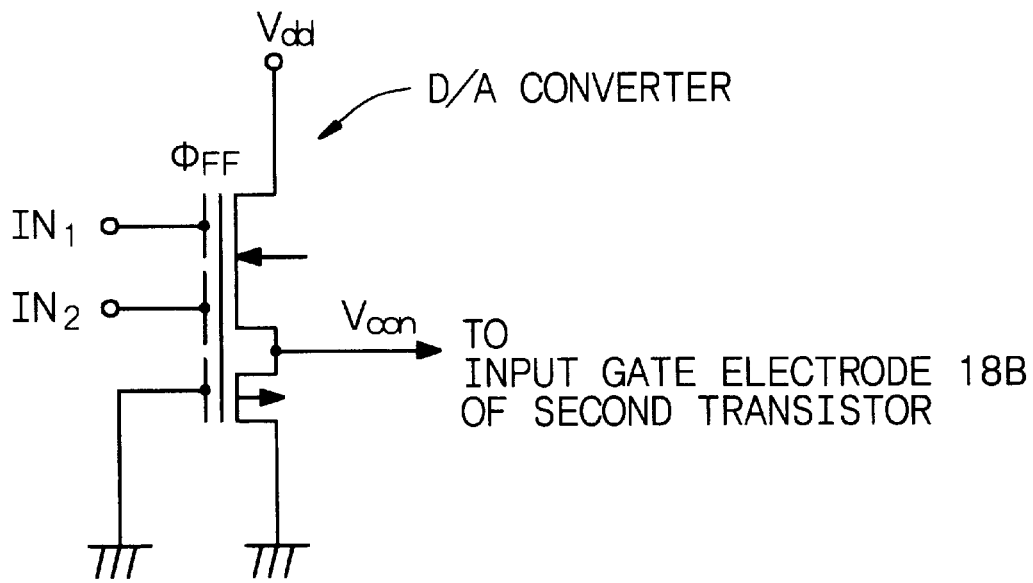
FIG. 10A is an equivalent diagram showing an example in which a threshold-value control voltage generator (D/A converter) comprises a variable threshold voltage field-effect transistor, and FIG. 10B schematically shows its output characteristics.

The threshold-value control voltage generator may comprise a conventional D/A converter, while it preferably comprises an n-channel type variable threshold voltage field-effect transistor constituted of a neuron MOS transistor for accomplishing a simple configuration, a simple circuit and a decrease in a circuit area. FIG. 10A shows a circuit diagram of the above D/C converter. The D/A converter is composed of source/drain regions, a channel-forming region interposed between the source/drain regions, one floating electrode formed above the channel-forming region through a first insulating layer, and a plurality of input gate electrodes (two input gate electrodes in Example 2) formed above the floating electrode through a second insulating layer. Signals corresponding to multi-valued data to be stored are inputted to the input gate electrodes. That is, two input gate electrodes of the D/A converter are connected to input lines $IN_1$ and $IN_2$, and voltages corresponding to binary data of "0" data and "1" data are inputted to the two input gate electrodes of the D/A converter from the input line $IN_1$, $IN_2$. Preferably, the D/A converter comprises a neuron CMOS transistor into which a p-channel type neuron MOS transistor is incorporated to work as an active load and which constitutes a source-follower circuit. The drain region of the n-channel type neuron MOS transistor is connected to a source voltage $V_{dd}$, and the source region of the n-channel type neuron MOS transistor is used as an output terminal. In this case, the threshold-value control voltage $V_{con}$ outputted to the output terminal is expressed by the following expression (4);

$$V_{con} = \Phi_{FF} - V_{th}^* \quad (4)$$

wherein $\Phi_{FF}$ is a potential of the floating electrode in the neuron MOS transistor constituting the D/A converter 10 and $V_{th}^*$ is a potential of the floating electrode when a channel is induced in the channel-forming region to allow the neuron MOS transistor to be in an ON-state.

Figure 10B:
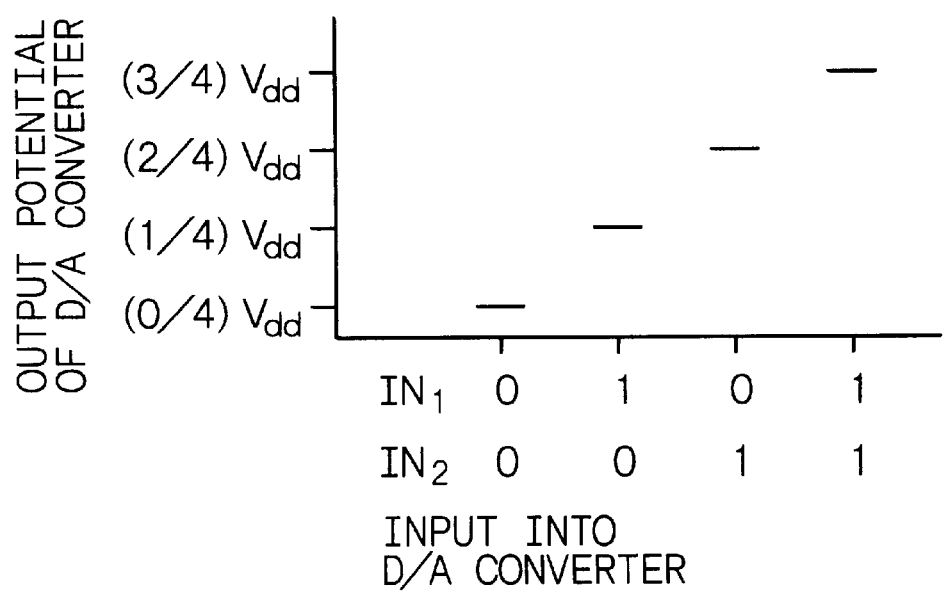

When the transistor is designed to attain $V_{th}^*=0$ volt, $V_{con}=\Phi_{FF}$. Therefore, a voltage corresponding to binary data of "0" data and "1" data inputted to the input gate electrode of the D/A converter is converted by the D/A converter and outputted as a threshold-value control voltage $V_{con}$ and inputted to the input gate electrode 18B. FIG. 10B schematically shows output characteristics of the D/A converter. The D/A converter outputs a step-shaped multi-valued potential as shown in the following Table 2.

TABLE 2

| Input data | Output voltage (volt) |
|---|---|
| (1,1) | $(3/4)V_{dd}$ |
| (1,0) | $(2/4)V_{dd}$ |
| (0,1) | $(1/4)V_{dd}$ |
| (0,0) | $(0/4)V_{dd} = 0$ |

Figure 6:
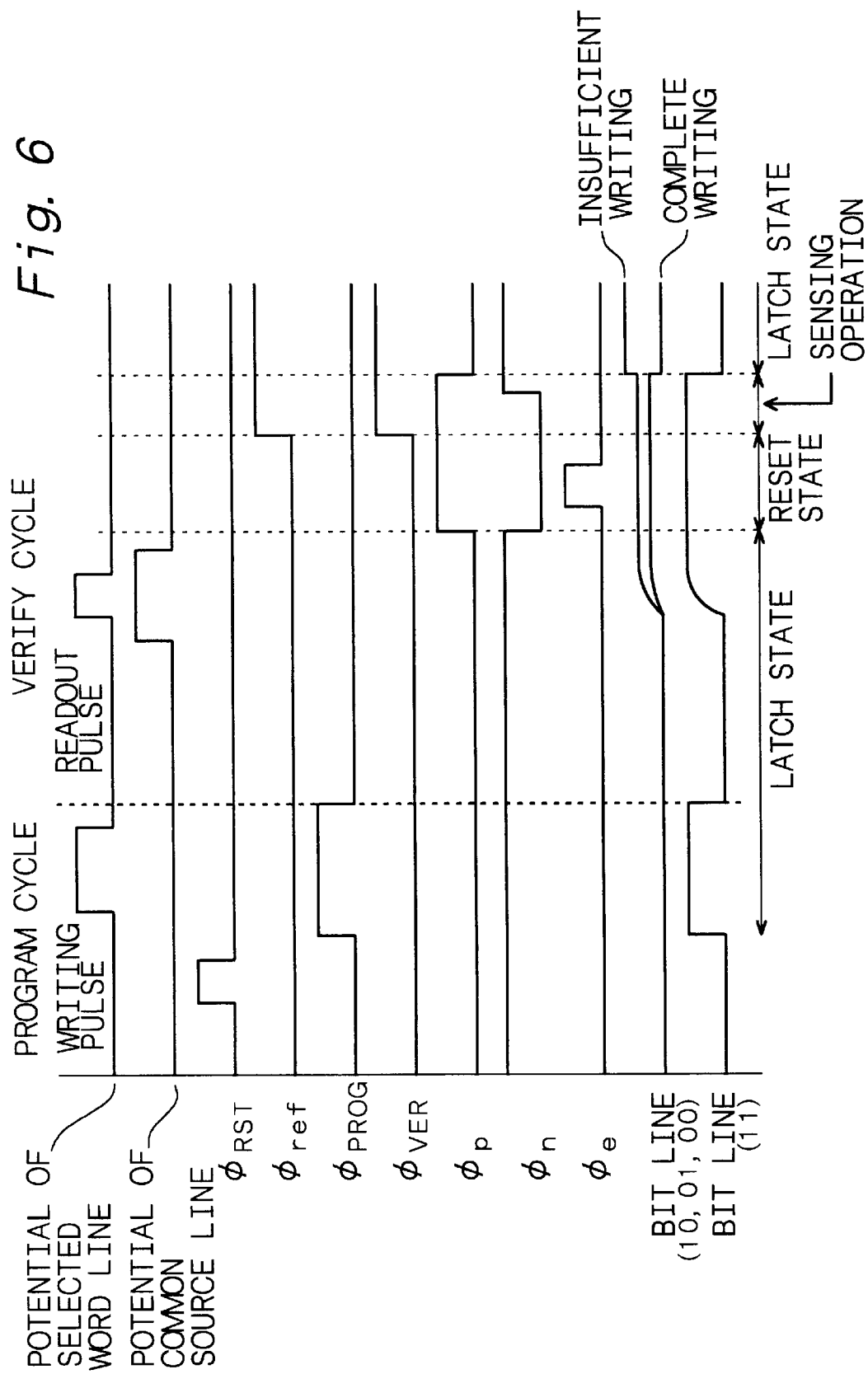
FIG. 6 shows signal waveforms in a program cycle and a verify cycle.

The performance of the program-verify circuit in Example 2, the performance of writing binary data in the NAND type memory cell (program cycle) and the performance of verify per bit (verify cycle) will be explained with reference to FIG. 5 showing the circuit diagram of the program-verify circuit and FIG. 6 showing signal waveforms of the verify cycle hereinafter.

The first inverter $INV_1$, the output potential of the D/A converter and the reference potential $V_{ref}$ are pre-designed so as to attain the following. When the D/A converter outputs a threshold-value control voltage $V_{con}=(3/4)V_{dd}$, the node $N_1$ of the latch-type sensing circuit shown in FIG. 5 is allowed to be in an "L" state and the node $N_2$ is allowed to be in an "H" state even if the reference potential $V_{ref}$ is inputted to the first input portion of the first inverter $INV_1$. Further, the first inverter $INV_1$, the second inverter $INV_2$, the output potential of the D/A converter and the reference potential $V_{ref}$ are pre-designed so as to attain the following. When the D/A converter outputs a threshold-value control voltage $V_{con}=(2/4)V_{dd}$, $(1/4)V_{dd}$ and $(0/4)V_{dd}$, the threshold value of logical inversion of the first inverter $INV_1$ is allowed to be $P_1$, $P_2$ and $P_3$, respectively. FIG. 5, FIG. 7 and FIG. 8 omit showing of a circuit for precharging the bit line, a circuit for generating and applying a writing pulse, a circuit for generating and applying a readout pulse and a circuit for generating and applying a potential to the common source line.

When the performance of writing data in the memory elements constituting the NAND type memory cell is initiated, first, the D/A converter outputs the output potential shown in Table 2 depending upon data to be written in the memory element, and the output potential is inputted to the input gate electrode 18B of the first inverter $INV_1$. Activation signals $\phi_P$ and $\phi_n$ are pre-set at 0 volt and $V_{cc}$ volt, respectively, to allow the transistors for switching $TR_A$ and $TR_B$ to be in an ON-state. Then, the reset transistor $TR_{RST}$ is turned on. As a result, when data to be written in the memory element is (1,0), (0,1) or (0,0), data in the latch-type sensing circuit is re-setted, and an initial data is latched in the latch-type sensing circuit. That is, the node $N_1$ in FIG. 5 is allowed to be in an "H" state (i.e., $V_{cc}$ volt ), and the node $N_2$ is allowed to be in an "L" state (i.e., 0 volt ). When data to be written in the memory element is (1,1), the D/A converter outputs an output potential of $(3/4)V_{dd}$, the node $N_1$ in FIG. 5 is in an "L" state (i.e., 0 volt), and the node $N_2$ is in an "H" state (i.e., $V_{cc}$ volt ).

Then, the program cycle is carried out. That is, the transistor for programming $TR_{PROG}$ is turned on, and the transistor for verification $TR_{verify}$ is maintained in an OFF-state. When data to be written in the memory element is (1,0), (0,1) or (0,0), an initial data ("H" state) latched in the latch-type sensing circuit is inverted to an "L" state (0 volt) since the inverter $INV_{10}$, is provided, and such a state is outputted to the bit line BL. In FIG. 6, such bit lines are shown by "Bit line (10,01,00)". When a potential of, for example, 20 volts is applied to a selected word line, for example, 20 volts is applied to the control gate of the memory element, whereby electrons are injected from the channel-forming region to the floating gate due to a Fowler-Nordheim-tunneling, and the threshold voltage $V_{th}$ of the memory element increases.

When data (1,1) is written in the memory element, initial data ("L" state latched in the latch-type sensing circuit is inverted to an "H" state since the inverter $INV_{10}$ is provided, and such a state is outputted to the bit line BL. In FIG. 6, the above bit line is shown by "Bit line (11)". Therefore, electrons are not injected from the channel-forming region to the floating gate, no data is written in the memory element, and a threshold voltage $V_{th-11}$ which is a data-erased state is retained.

Writing pulse is applied to the memory element once, then the transistor for programming $TR_{PROG}$ is turned off, and the verify cycle is carried out. That is, first, all the bit lines are set at a potential of 0 volt, and a potential of, for example, 6 volts is applied to the common source line. Then, a readout pulse is applied to the memory element, and then, the bit line BL is allowed to be in a floating state, whereby the bit line output potential $V_{BL}$ shown in Table 1 appears in the bit line BL depending upon data stored in the memory element. That is, the configuration of the memory cell is designed so as to attain the following. The bit line output potential $V_{BL}$ in the verify cycle is $V_{BL-10}$ at a point of time when data (1,0) is written in the memory element, the bit line output potential $V_{BL}$ is $V_{BL-01}$ at a point of time when data (0,1) is written in the memory element, the bit line output potential $V_{BL}$ is $V_{BL-00}$ at a point of time when data (0,0) is written in the memory element, and $V_{BL-10} > V_{BL-01} > V_{BL-00}$. Before data (1,0) is written in the memory element, the bit line output potential $V_{BL}$ in the verify cycle is higher than $P_1$. Before data (0,1) is written in the memory element, the bit line output potential $V_{BL}$ is higher than $P_2$. Before data (0,0) is written in the memory element, the bit line output potential $V_{BL}$ is higher than $P_3$.

Then, activation signals $\phi_P$ and $\phi_n$ are set at $V_{cc}$ volt and 0 volt, respectively, thereby to turn off the transistors for switching $TR_A$ and $TR_B$ and to allow the latch-type sensing circuit to be in a floating state, and then, an equalization signal $\phi_e$ is set at $V_{cc}$ volt, thereby to allow transistors $TR_E$ and $TR_F$ to be in an ON-state and to equalize both terminals of the latch-type sensing circuit to be $(1/2)V_{cc}$ volt. In this manner, the latch-type sensing circuit is re-setted. Then, the transistor for verification $TR_{VERIFY}$ and the transistor for reference $TR_{ref}$ are turned on, whereby the bit line output potential $V_{BL}$ is compared with the apparent reference potential $V'_{ref}$. Then, an activation signal $\phi_n$ is inputted to the transistor for switching $TR_B$, and then an activation signal $\phi_P$ is inputted to the transistor for switching $TR_A$.

When writing is insufficient for data to be written, the bit line output potential $V_{BL}$ is higher than the apparent reference potential $V'_{ref}$, i.e., it is higher than the threshold value of logical inversion of the first inverter $INV_1$, so that the node $N_1$ of the latch-type sensing circuit is allowed to be in an "H" state. When writing is completed, i.e., when the bit line output potential $V_{BL}$ is equal to, or smaller than $P_1$, $P_2$ and $P_3$ in FIG. 9B with regard to data (1,0), (0,1) and (0,0), the bit line output potential $V_{BL}$ is lower than the apparent reference potential $V_{ref}$, i.e., it is lower than the threshold value of logical inversion of the first inverter $INV_1$, so that the node $N_1$ of the latch-type sensing circuit is allowed to be in an "L" state. With regard to data (1,1), the bit line output potential $V_{BL}$ is higher than the apparent reference potential $V'_{ref}$, but the D/A converter outputs the output potential of $(3/4)V_{dd}$, so that node $N_1$ is in an "L" state (i.e., 0 volt).

As described above, the latch-type sensing circuit senses and latches a state of the bit line output potential $V_{BL}$ in the verify cycle. The latch-type sensing circuit operates to a subsequent re-program cycle in the above state. That is, in the subsequent program cycle, 0 volt is supplied to the bit line BL for the memory element in which writing is insufficient, and a potential of, for example, 6 volts is supplied to the bit line BL for the memory element in which writing is completed.

EXAMPLE 3

Figure 11A:
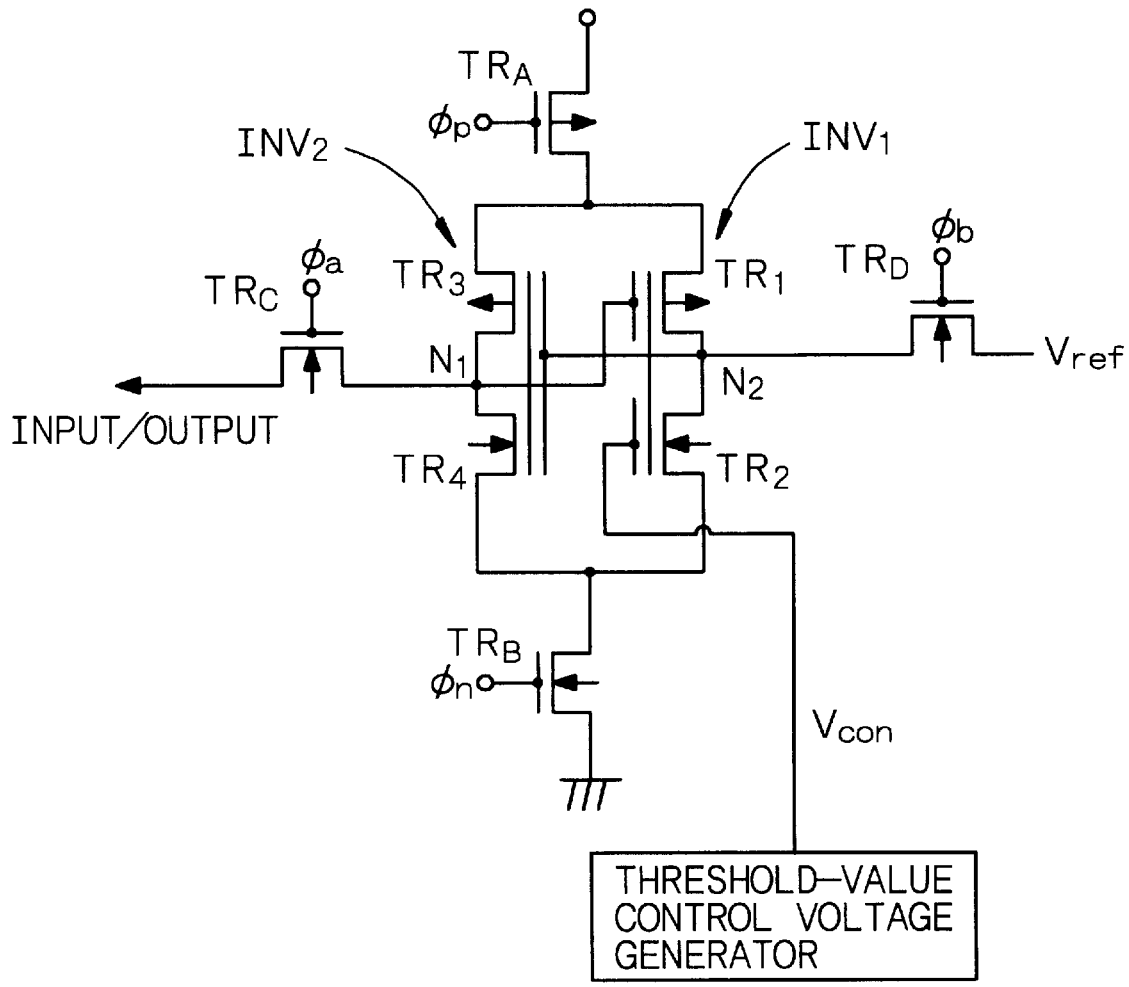
FIG. 11A shows a circuit diagram of a latch-type sensing circuit in Example 3.
Figure 11B:
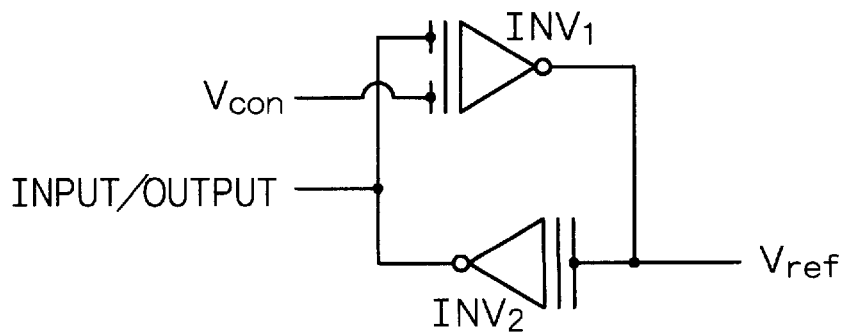
FIG. 11B is an equivalent circuit diagram thereof.

Example 3 relates to a latch-type sensing circuit according to the second aspect of the present invention. FIG. 11 A shows a circuit diagram of the latch-type sensing circuit, and FIG. 11B shows an equivalent circuit diagram thereof. The latch-type sensing circuit in Example 3 also comprises a first inverter $INV_1$ and a second inverter $INV_2$, and the first inverter $INV_1$ has a variable the threshold value of logical inversion. The first inverter $INV_1$ has an input portion (first input portion), which corresponds to the input/output terminal of the latch-type sensing circuit and is connected to an output portion of the second inverter $INV_2$, and an input portion (second input portion) which is for receiving a potential (threshold-value control voltage) $V_{con}$ for controlling threshold value of logical inversion of the first inverter $INV_1$. An input portion of the second inverter $INV_2$ is for receiving a reference potential $V_{ref}$ and is connected to an output portion of the first inverter $INV_1$. A threshold-value control voltage generator for generating the threshold-value control voltage $V_{con}$ may comprise a conventional D/A converter, or it may also comprise the D/A converter explained in Example 2.

Detailed explanations of structures of the first inverter $INV_1$ and the second inverter $INV_2$ and other transistors constituting the latch-type sensing circuit in Example 3 are omitted, since they can be same as those in Example 1.

The potential $\Phi_{F2}$ of the floating electrode 16 is given by the following expression (5), $$\Phi_{F2}(C_A V_{in} + C_B V_{con})/C_{TOTAL} \qquad (5)$$

wherein $C_A$ is a coupling capacitance between the floating electrode 16 which is common to the first transistor $TR_1$ and the second transistor $TR_2$, and the input gate electrode 18A corresponding the one input gate electrode, $C_B$ is a coupling capacitance between the floating electrode 16 and the input gate electrode 18B corresponding to the other input gate electrode, $C_0$ is a coupling capacitance between the floating electrode 16 and the silicon semiconductor substrate 10, $C_{TOTAL} = (C_0 + C_A + C_B)$, and $V_{in}$ and $V_{con}$ are potentials inputted to the input gate electrodes 18A and 18B, provided that the silicon semiconductor substrate 10 has a potential of 0 volt.

The transistors for switching $TR_A$, $TR_B$, $TR_C$ and $TR_D$ are turned off, the latch-type sensing circuit is allowed to be in a floating state, and then the transistors for switching $TR_C$ and $TR_D$ are turned on. An input potential $V_{in}$ is to be inputted to the input/output terminal of the latch-type sensing circuit. That is, the node $N_1$ in FIG. 11 A has a potential of $V_{in}$ and the node $N_2$ has a potential of $V_{ref}$. Then, an activation signal $\phi_n$ for activating the latch-type sensing circuit is inputted to the transistor for switching $TR_B$. Then, an activation signal $\phi_P$ is inputted to the transistor for switching $TR_A$.

An "H" state or an "L" state to be retained in the latch-type sensing circuit in Example 3, i.e., the threshold value of logical inversion of the inverter $INV_1$ of the latch-type sensing circuit, is dependent upon $\Phi_{F2}$. Further, as is clear from the expression (5), $\Phi_{F2}$ depends upon $V_{con}$. That is, the higher the threshold-value control voltage $V_{con}$ is, the lower the input potential $V_{in}$ at which the logic of the first inverter $INV_1$ is inverted is. As described above, the threshold value of logical inversion of the first inverter $INV_1$ can be set at an arbitrary voltage by changing the threshold-value control voltage $V_{con}$ to be inputted to the threshold-voltage control gate electrode in the first inverter $INV_1$. In other words, regarded from the input/output terminal of the latch-type sensing circuit, it can appear that the reference potential $V_{ref}$ changes. That is, an apparent reference potential $V'_{ref}$ can be changed.

As FIG. 2C shows an equivalent circuit diagram, it is assumed that the input gate electrodes of the first inverter $INV_1$ are arranged to be one and that an apparent input potential V'$_{in}$ is applied to the above input gate electrode. The relationship between the apparent input potential V'$_{in}$ and Φ$_{F2}$ satisfies the following expression (6). Further, the following expression (7) can be obtained from the expressions (6) and (5).

$$\Phi_{F2} = C_i V'_{in}/C_{TOTAL}$$

$$\approx (C_A + C_B) V'_{in}/C_{TOTAL} \quad (6)$$

$$V'_{in} \approx (C_A V_{in} + C_B V_{con})/(C_A + C_B) \quad (7)$$

Therefore, the apparent input potential V'$_{in}$ in the input/output terminal of the latch-type sensing circuit can be compared with the reference potential V$_{ref}$ in the latch-type sensing circuit with changing the threshold-value control voltage V$_{con}$, an analog potential in the input/output terminal of the latch-type sensing circuit can be converted to binary data, and the binary data can be retained (latched) in the latch-type sensing circuit. In other words, the apparent reference potential V'$_{ref}$ can be relatively changed by changing the threshold-value control voltage V$_{con}$, and when regarded from the input/output terminal of the latch-type sensing circuit, it can be regarded that the reference potential V$_{ref}$ changes. That is, if the potential V$_{in}$ in the input/output terminal of the latch-type sensing circuit is higher than the apparent reference potential V'$_{ref}$, an "H" state is retained in the input/output terminal in the latch-type sensing circuit, and if the potential V$_{in}$ in the input/output terminal of the latch-type sensing circuit is lower than the apparent reference potential V'$_{ref}$, an "L" state is retained in the input/output terminal of the latch-type sensing circuit.

Figure 12:
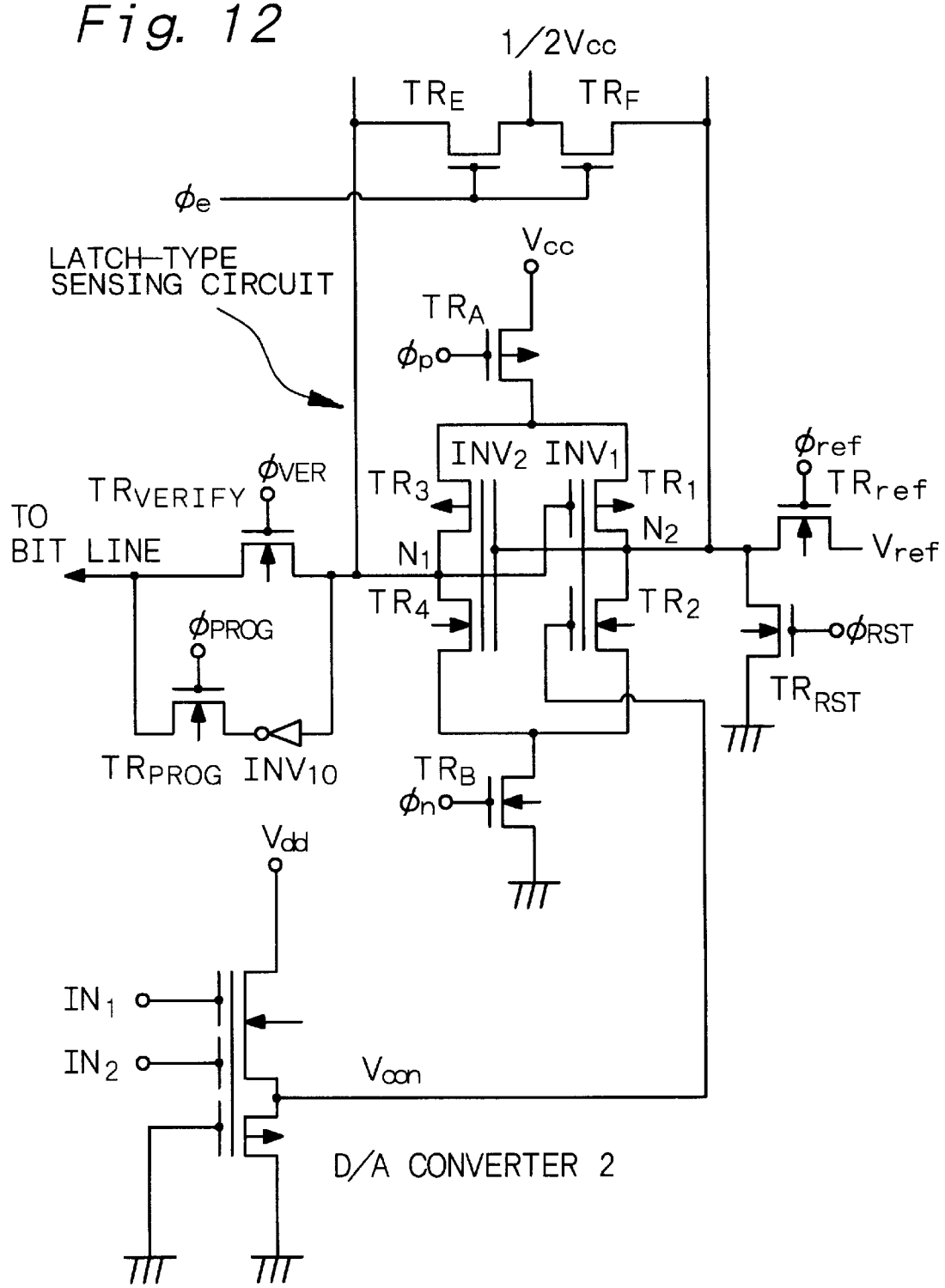
FIG. 12 shows a circuit diagram of a program-verify circuit in Example 3.

FIG. 12 shows a circuit diagram of a program-verify circuit in which the latch-type sensing circuit of Example 3 is incorporated. The performance of the program-verify circuit is substantially the same as the performance of the program-verify circuit explained in Example 2, and detailed explanations thereof are therefore omitted. However, the D/A converter 2 outputs a step-shaped multi-valued potential as shown in the following Table 3. That is, the threshold-value control voltage generator comprises a D/A converter 2 having inverters provided before the input gate electrodes of the D/A converter explained in Example 2.

TABLE 3

| Input data | Output voltage (volt) |
| --- | --- |
| (1,1) | (0/4)V$_{dd}$ = 0 |
| (1,0) | (1/4)V$_{dd}$ |
| (0,1) | (2/4)V$_{dd}$ |
| (0,0) | (3/4)V$_{dd}$ |

EXAMPLE 4

Figure 13A:
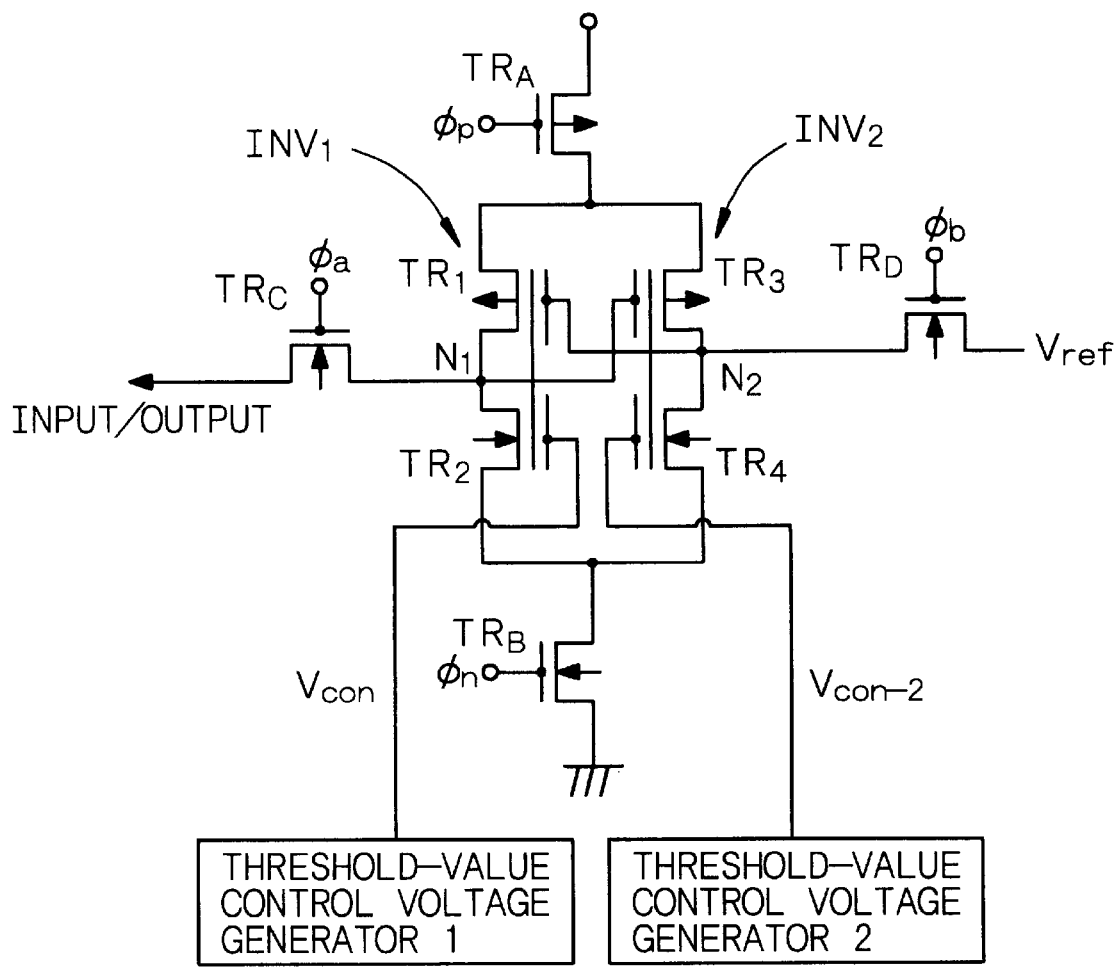
FIG. 13A shows a circuit diagram of a latch-type sensing circuit in Example 4.
Figure 13B:
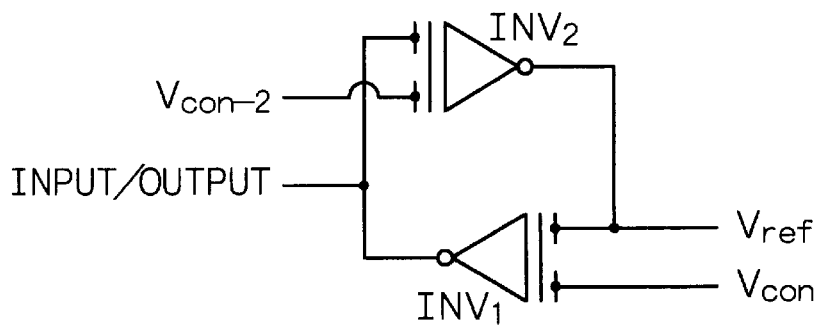
FIG. 13B shows an equivalent circuit diagram thereof.

The latch-type sensing circuit in Example 4 is a variant of the latch-type sensing circuit explained in Example 1, and the second inverter INV$_2$ in Example 1 is replaced with the first inverter INV$_1$ in Example 3. FIG. 13A shows a circuit diagram of the latch-type sensing circuit, and FIG. 13B shows an equivalent circuit diagram thereof. In the latch-type sensing circuit, the threshold value of logical inversion of the second inverter INV$_2$ is variable, and the second inverter INV$_2$ comprises a p-channel type third transistor TR$_3$ and an n-channel type fourth transistor TR$_4$ having a conductivity type opposite to a conductivity type of the third transistor TR$_3$.

As FIGS. 3A and 3B show schematic partial cross-sectional views, each of the third transistor TR$_3$ and the fourth transistor TR$_4$ is composed of source/drain regions 15A$_1$, 15A$_2$, 15B$_1$ and 15B$_2$, channel-forming regions 14A and 14B interposed between the source/drain regions 15A$_1$, 15A$_2$, 15B$_1$ and 15B$_2$, floating electrodes 16 formed above the channel-forming regions 14A and 14B through a first insulating layer 13, and input gate electrodes 18A and 18B formed above the floating electrodes 16 through a second insulating layer 17. The floating electrode 16 of the third transistor TR$_3$ and the floating electrode 16 of the fourth transistor TR$_4$ are of one common electrode. The input gate electrode 18A which is one input gate electrode corresponds to an input portion of the second inverter INV$_2$, and a potential V$_{con-2}$ for controlling the threshold value of logical inversion of the second inverter INV$_2$ is inputted to the input gate electrode 18B which is the other input gate electrode. The input gate electrode 18A may be the above "the other" input gate electrode, and the input gate electrode 18B may be the above "one" input gate electrode.

Figure 14:
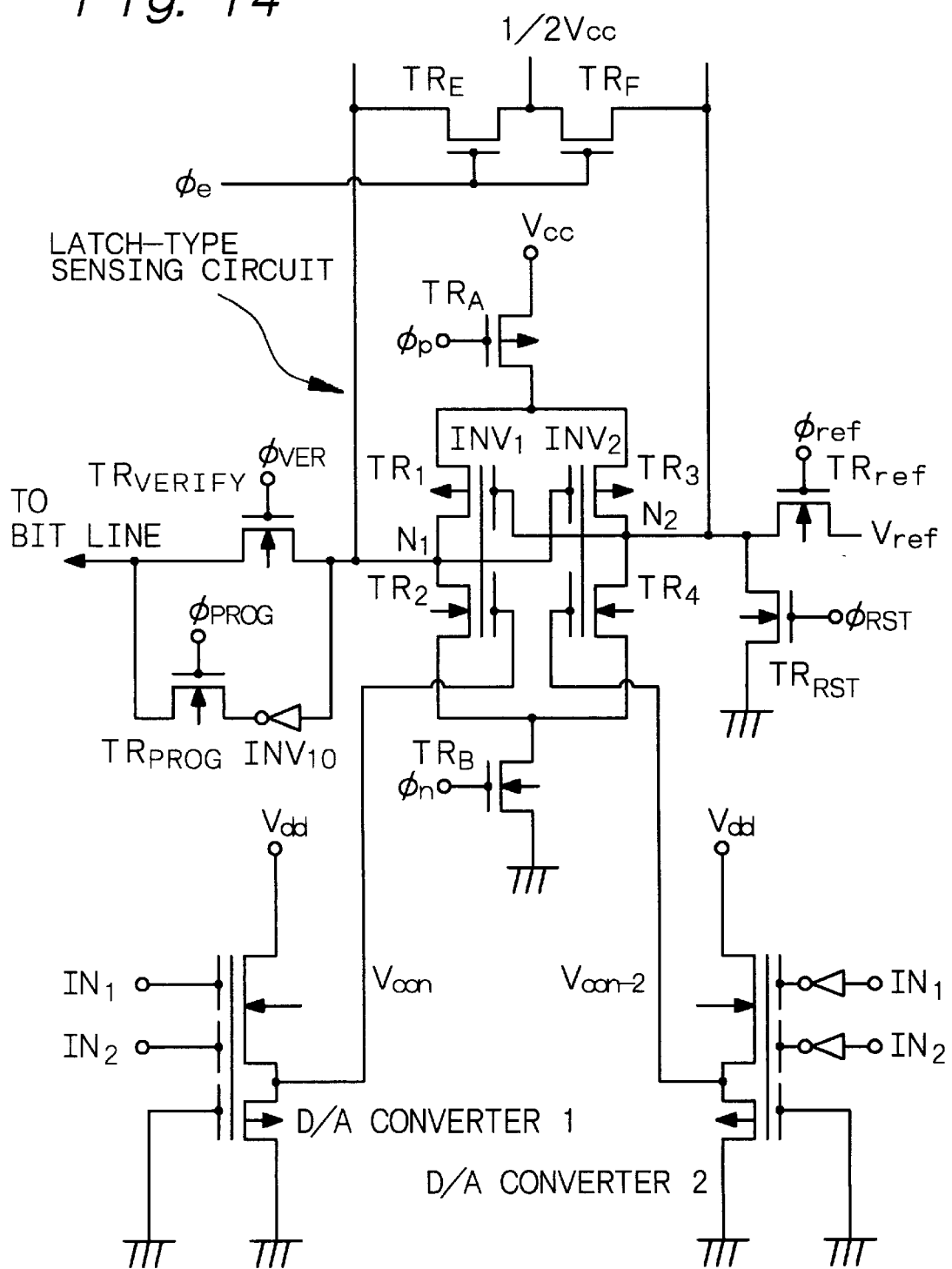
FIG. 14 shows a circuit diagram of a program-verify circuit in Example 4.

The performance of the latch-type sensing circuit in Example 4 is the same as the performance of a combination of performances of the latch-type sensing circuits explained in Examples 1 and 3, and detailed explanations thereof are therefore omitted. FIG. 14 shows a program-verify circuit into which the latch-type sensing circuit in Example 4 is incorporated. The performance of the program-verify circuit is substantially the same as the performance of the program-verify circuit explained in Example 2, and detailed explanations thereof are therefore omitted. In FIG. 14, a D/A converter 1 corresponds to the D/A converter explained in Example 2, and a D/A converter 2 corresponds to the D/A converter explained in Example 3. The output of the D/A converter 2 is shown as V$_{con-2}$.

When the threshold value of logical inversion of each of the first inverter INV$_1$ and the second inverter INV$_2$ are variable as described above, degree of freedom with regard to controlling the threshold value of logical inversion of the latch-type sensing circuit as a whole increases.

EXAMPLE 5

The latch-type sensing circuit in Example 5 is also a variant of the latch-type sensing circuit in Example 1. In the latch-type sensing circuit in Example 5, the second inverter INV$_2$ has a fixed threshold value of logical inversion, and as shown in a circuit diagram of in FIG. 15, the second inverter INV$_2$ comprises a conventional CMOS. When the balance controlling of the first inverter INV$_1$ and the second inverter INV$_2$ leaves an additional scope, the second inverter INV$_2$ can be composed of a conventional CMOS as described above. The latch-type sensing circuit in Example 5 and the performance thereof are the same as those of the latch-type sensing circuit explained in Example 1 except for the above point, and detailed explanations thereof are therefore omitted. The performance of a program-verify circuit into which the latch-type sensing circuit in Example 5 is incorporated is substantially the same as the performance of the program-verify circuit explained in Example 2, and detailed explanations thereof are therefore omitted.

Figure 15:
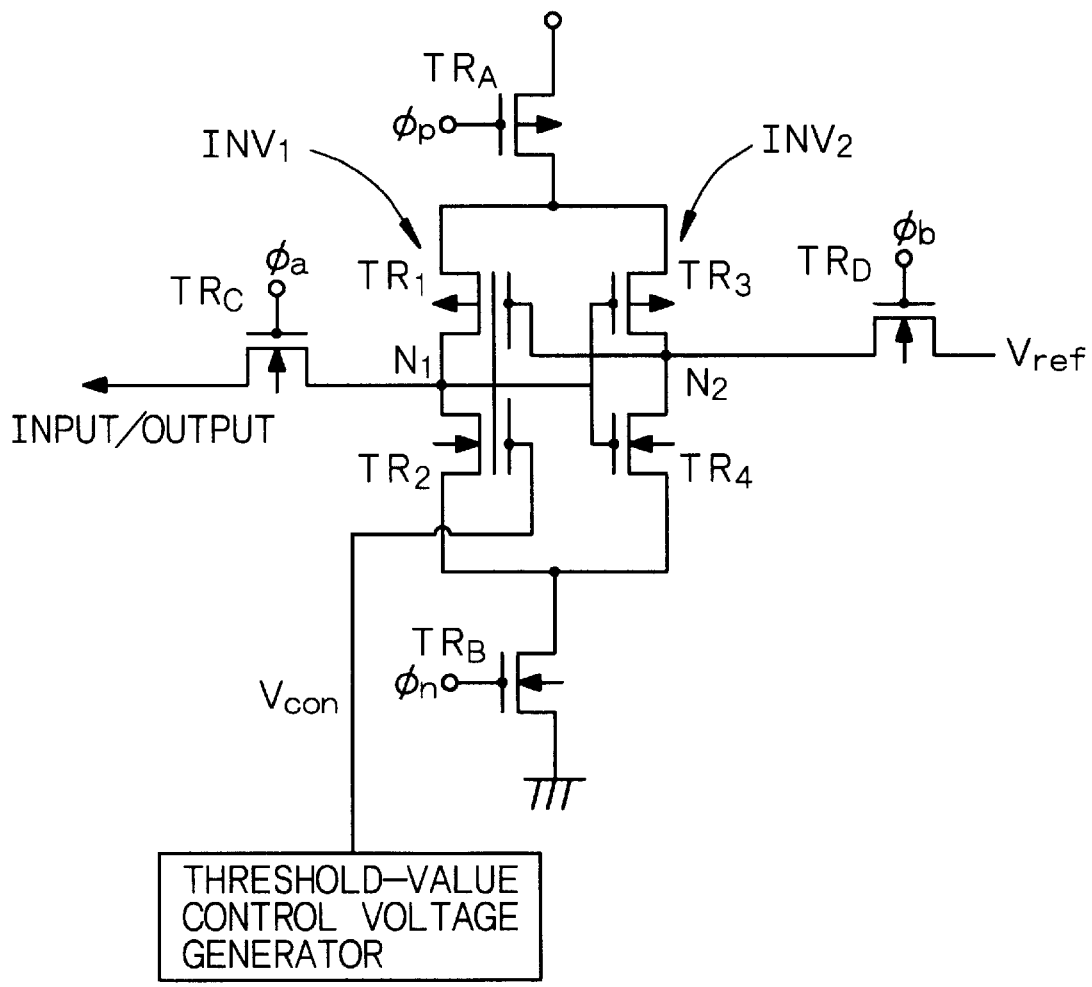
FIG. 15 shows a circuit diagram of a latch-type sensing circuit in Example 5.
Figure 16:
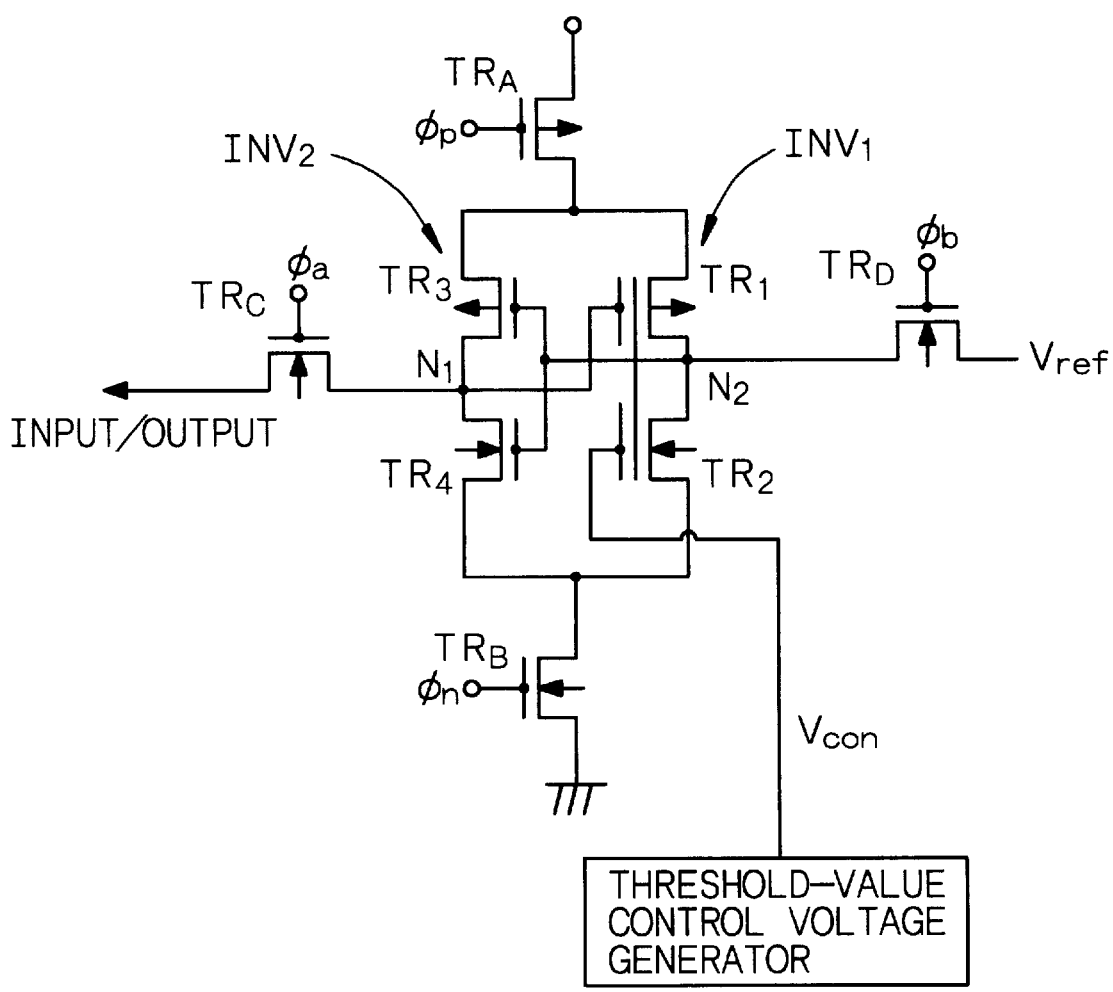
FIG. 16 shows a circuit diagram of a variant of the latch-type sensing circuit in Example 5.

FIG. 16 shows a latch-type sensing circuit according to the second aspect of the present invention, which is a variant of the latch-type sensing circuit shown in FIG. 15. In the latch-type sensing circuit, the first input portion of the first inverter INV$_1$ corresponds to the input/output terminal of the latch-type sensing circuit. And, the first input portion is connected to the output portion of the second inverter INV$_2$. A potential (threshold-value control voltage) V$_{con}$ for controlling the threshold value of logical inversion of the first inverter $INV_1$ is applied to the second input portion of the first inverter $INV_1$ from the threshold-value control voltage generator. Further, a reference potential $V_{ref}$, is inputted to the input portion of the second inverter $INV_2$, and the output portion of the first inverter $INV_1$ is connected to the input portion of the second inverter $INV_2$. The second inverter $INV_2$ comprises a conventional CMOS.

EXAMPLE 6

Figure 17:
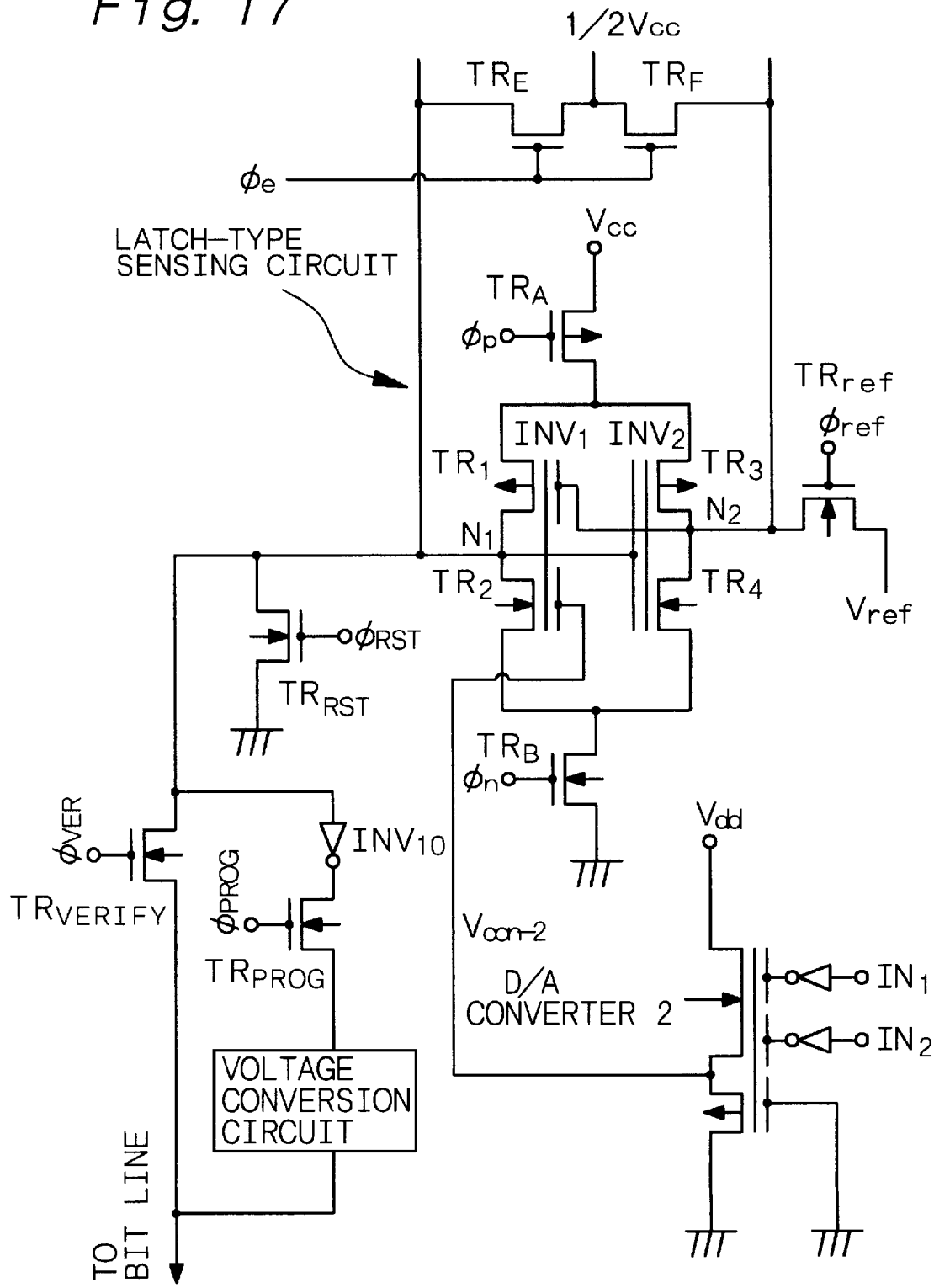
FIG. 17 shows a circuit diagram of a program-verify circuit in Example 6.

Example 6 is a variant of Example 2. In Example 6, an electrically re-writable memory cell, which has a floating gate and a control gate and is for storing ternary or higher multi-valued data, is a NOR type memory cell. FIG. 17 shows a circuit diagram of a program-verify circuit in Example 6. The program-verify circuit in Example 6 differs from the counterpart in Example 2 in that a reset transistor $TR_{RST}$ is provided on the input/output terminal side of the latch-type sensing circuit, that a voltage convert circuit having a known constitution is provided between the transistor for programming $TR_{PROG}$ and a bit line BL and that a D/A converter has a different output and comprises the D/A converter explained in Example 3.

Figure 18A:
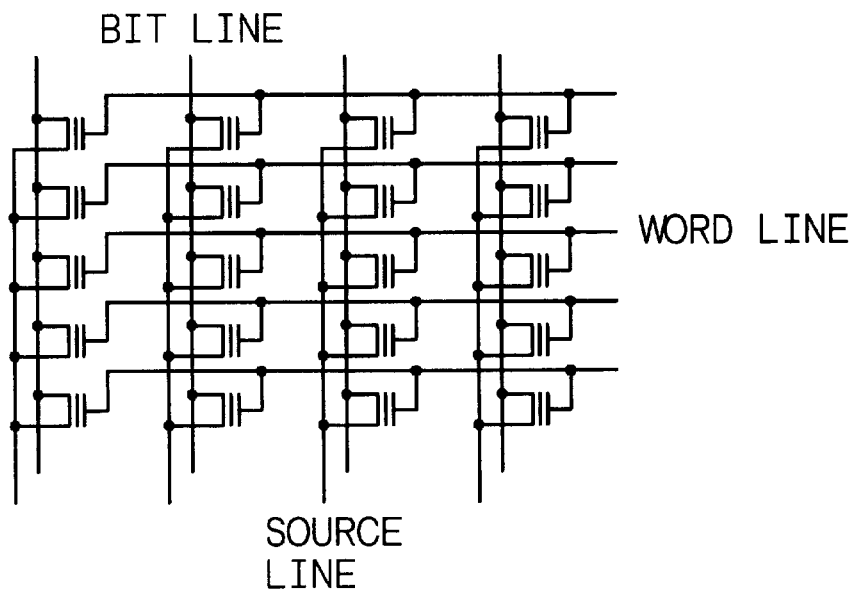
FIG. 18A shows a cell-array configuration of a NOR type memory cell.
Figure 18B:
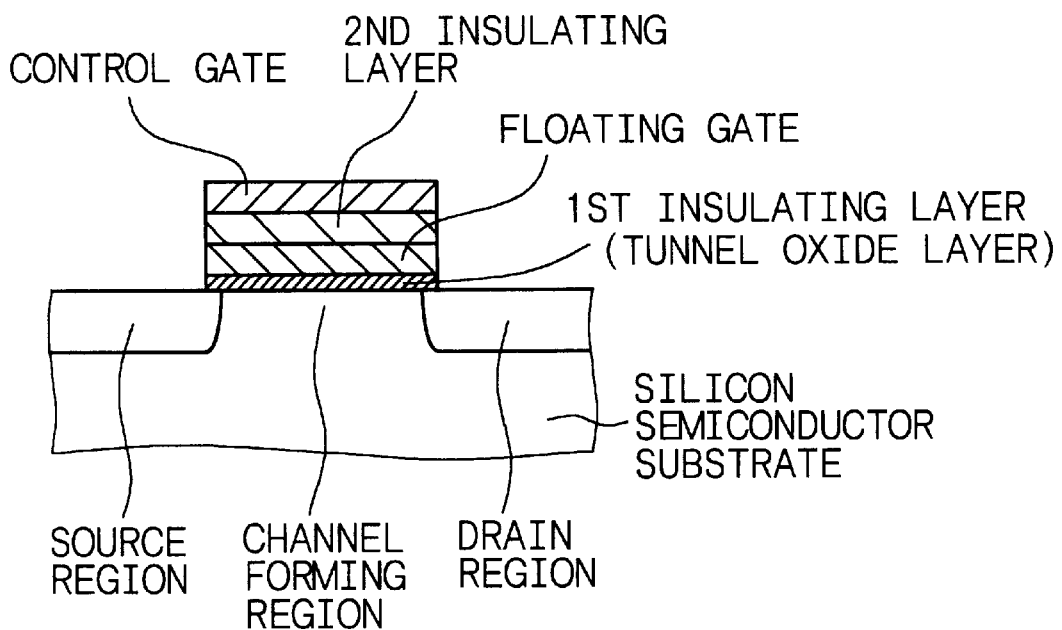
FIG. 18B is a schematic partial cross-sectional view of a memory element constituting the NOR type memory cell.

FIG. 18A shows a cell-array structure of the NOR type memory cell. FIG. 18B shows a schematic partial cross-sectional view of a memory element constituting the NOR type memory cell. The cell-array and the memory element are structurally the same as those of a conventional NOR type memory cell. In writing data in the memory element, a positive high voltage is applied to a word line and a bit line, and hot electrons generated in the drain region of the memory element are injected into the floating gate, to allow the threshold voltage $V_{th}$ of the memory element to be a predetermined value. The value of threshold voltage $V_{th}$ of the memory element, i.e., an amount of electrons injected into the floating gate, is controlled by precisely controlling a voltage to be applied to the control gate and the drain region. When data is erased, the electrons are extracted from the floating gate to the source region by applying a high voltage to the source region, to allow the threshold voltage $V_{th}$ of the memory element to be a lowest value.

FIG. 19 schematically shows a distribution of memory elements with regard to reference points ($P_0$, $P_1$, $P_2$, $P_3$) and reference voltages ($R_1$, $R_2$, $R_3$) when 2 bits are stored in one memory element. Threshold voltages $V_{th}$ of memory elements storing data (1,1), (1,0), (0,1) and (0,0) and the reference voltages $V_{R1}$, $V_{R2}$ and $V_{R3}$ have a relationship as shown in the following Table 4.

TABLE 4

| data (1,1) | $V_{th} < V_{R1}$ |
| data (1,0) | $V_{R1} < V_{th} < V_{R2}$ |
| data (0,1) | $V_{R2} < V_{th} < V_{R3}$ |
| data (0,0) | $V_{R3} < V_{th}$ |

The threshold voltage (positive potential) of the memory element when 2 bits are stored in one memory element, i.e., the threshold voltages of the memory elements storing data (1,1), (1,0), (0,1) and (0,0) are respectively $V_{th-11}$, $V_{th-10}$, $V_{th-01}$ and $V_{th-00}$ (provided that $V_{th-11} < V_{th-10} < V_{th-01} < V_{th-00}$). These threshold voltages $V_{th}$ have a distribution as shown in FIG. 19. The lowest threshold voltage $V_{th-11}$ of these corresponds to a data-erased state, i.e., data (1,1).

The performance of writing data in the memory element comprises a program cycle and a verify cycle.

In the program cycle, a voltage of, for example, 12 volts is applied to the control gate of the memory element, and a voltage of, for example, 10 volts is applied to the drain region from the bit line. Hot electrons generated in the drain region by applying the voltage in the form of pulses to the drain region are injected into the floating gate to increase the threshold voltage $V_{th}$ of the memory element. In the verify cycle, it is evaluated by the same performance as that the readout performance whether or not the threshold voltage $V_{th}$ of the memory element is a predetermined value. When the threshold voltage $V_{th}$ of the memory element reaches the predetermined value, the performance of writing is finished. When the threshold voltage $V_{th}$ of the memory element has not reached the predetermined value, the program cycle is repeated. By repeatedly carrying out the program cycle and the verify cycle as described above, the threshold voltage $V_{th}$ of the memory element increases with an increase in the number of pulses applied to the drain region from the bit line BL, and it finally reaches the predetermined value. The D/A converter 2 outputs the step-shaped multi-valued potentials shown in Table 3.

The performance of the program-verify circuit in Example 6, the performance of writing binary data in the NOR type memory cell (program cycle) and the performance of verifying per bit (verify cycle) will be explained hereinafter.

The first inverter $INV_1$, the output potential of the D/A converter 2 and the reference potential $V_{ref}$ are pre-designed so as to attain the following. When the threshold-value control voltage $V_{con}=(0/4)V_{dd}$ is outputted from the D/A converter 2, the node $N_1$ of the latch-type sensing circuit shown in FIG. 17 is allowed to be in an "H" state and the node $N_2$ is allowed to be in an "L" state even if the reference potential $V_{ref}$ is applied to the first input portion of the first inverter $INV_1$. The first inverter $INV_1$, the second inverter $INV_2$, the output potential of the D/A converter 2 and the reference potential $V_{ref}$ are pre-designed so as to attain the following. When the threshold-value control voltage $V_{con}=(1/4)V_{dd}$, $(2/4)V_{dd}$ or $(3/4)V_{dd}$ is outputted from the D/A converter 2, the threshold value of logical inversion of the first inverter INV, is $P_1$, $P_2$ or $P_3$, respectively.

When the performance of writing data in the memory element constituting the NOR type memory cell is initiated, first, the D/A converter 2 outputs the output potential shown in Table 3 depending upon data to be written in the memory element, and the output potential is inputted to the input gate electrode 18B (corresponding to "the other" input gate electrode) constituting the first inverter $INV_1$. Activation signals $\phi_P$ and $\phi_n$ are pre-set at 0 volt and $V_{cc}$ volt, respectively, to allow the transistors for switching $TR_A$ and $TR_B$ to be in an ON-state. Then, the reset transistor $TR_{RST}$ of the latch-type sensing circuit is turned on. As a result, when data to be written in the memory element is (1,0), (0,1) or (0,0), data in the latch-type sensing circuit is re-setted, and an initial data is latched in the latch-type sensing circuit. That is, the node $N_1$ in FIG. 17 is allowed to be in an "L" state (i.e., 0 volt), and the node $N_2$ is allowed to be in an "H" state (i.e., $V_{cc}$ volt). When data to be written in the memory element is (1,1), the D/A converter 2 outputs an output potential of $(0/4)V_{dd}$, the node $N_1$ in FIG. 17 is in an "H" state (i.e., $V_{cc}$ volt), and the node $N_2$ is in an "L" state (i.e., 0 volt).

Then, the program cycle is carried out. That is, the transistor for programming $TR_{PROG}$ is turned on, and the transistor for verification $TR_{VERIFY}$ is maintained in an OFF-state. When data to be written in the memory element is (1,0), (0,1) or (0,0), an initial data ("L" state) latched in the latch-type sensing circuit is inverted to an "H" state by the inverter $INV_{10}$, such a state is transferred to the voltage convert circuit to be converted to a high voltage (for example, 10 volts) signal, and the signal in the firm of a pulse is outputted to the bit line BL. On the other hand, a voltage of, for example, 12 volts is applied to the control gate of the memory element, whereby hot electrons generated in the drain region of the memory element are injected into the floating gate to increase the threshold voltage $V_{th}$ of the memory element.

When data (1,1) is written in the memory element, initial data latched in the latch-type sensing circuit is in an "H" state (i.e., $V_{CC}$ volt) and is inverted to an "L" state (i.e., 0 volt) by the inverter $INV_{10}$. Therefore, no data is written in the memory element, and the threshold voltage $V_{th-11}$ which is a data-erased state is retained.

Writing pulse is applied to the memory element once, then, the transistor for programming $TR_{PROG}$ is turned off, and the verify cycle is carried out. That is, current is flowed in the bit line BL in the same manner as in the performance of readout, and then the bit line BL is allowed to be in a floating state. The bit line output potential at this moment is $V_{BL}$. It is assumed that the bit line output potential $V_{BL}$ in the verify cycle at a point of time when data (1,0) is written in the memory element is $V_{BL-10}$, the bit line output potential $V_{BL}$ in the verify cycle at a point of time when data (0,1) is written in the memory element is $V_{BL-01}$, and the bit line output potential $V_{BL}$ in the verify cycle at a point of time when data (0,0) is written in the memory element is $V_{BL-00}$. The configuration of the memory cell is designed so as to satisfy $V_{BL-10} < V_{BL-01} < V_{BL-00}$. The lower limit values of the above $V_{BL-11}$, $V_{BL-10}$, $V_{BL-01}$ and $V_{BL-00}$ are $P_0$, $P_1$, $P_2$ and $P_3$, respectively. The bit line output potential $V_{BL}$ before data (1,0) is written in the memory element is lower than $P_1$. The bit line output potential $V_{BL}$ before data (0,1) is written in the memory element is lower than $P_2$. The bit line output potential $V_{BL}$ before data (0,0) is written in the memory element is lower than $P_3$.

Then, activation signals $\phi_P$ and $\phi_n$ are set at $V_{cc}$ volt and 0 volt, respectively, thereby to turn off the transistors for switching $TR_A$ and $TR_B$ and to allow the latch-type sensing circuit to be in a floating state, and an equalization signal $\phi_e$ is set at $V_{cc}$ volt, thereby to allow transistors $TR_E$ and $TR_F$ to be in an ON-state and to equalize both terminals of the latch-type sensing circuit to be $(1/2)V_{cc}$ volt. In this manner, the latch-type sensing circuit is re-setted. Then, the transistor for verification $TR_{VERIFY}$ and the transistor for reference $TR_{ref}$ are turned on, whereby the bit line output potential $V_{BL}$ is compared with the apparent reference potential $V'_{ref}$. Then, an activation signal $\phi_n$ is inputted to the transistor for switching $TR_B$, and then an activation signal $\phi_P$ is inputted to the transistor for switching $TR_A$.

When writing is insufficient for individual data to be written, the bit line output potential $V_{BL}$ is lower than the apparent reference potential $V'_{ref}$, i.e., it is lower than the threshold value of logical inversion of the first inverter $INV_1$, so that the node $N_1$ of the latch-type sensing circuit is allowed to be in an "L" state. When writing is completed, i.e., when the bit line output potential $V_{BL}$ is equal to, or higher than $P_1$, $P_2$ and $P_3$ in FIG. 19 with regard to data (1,0), (0,1) and (0,0), respectively, the bit line output potential $V_{BL}$ is higher than the apparent reference potential $V'_{ref}$ i.e., it is higher than the threshold value of logical inversion of the first inverter $INV_1$, so that the node $N_1$ of the latch-type sensing circuit is allowed to be in an "H" state. With regard to data (1,1), the bit line output potential $V_{BL}$ is higher than the apparent reference potential $V'_{ref}$, but the D/A converter 2 outputs an output potential of $(0/4)V_{dd}$, so that the node $N_1$ is in an "H" state (i.e., $V_{cc}$ volt).

As described above, the latch-type sensing circuit senses and retains (latches) a state of the bit line output potential $V_{BL}$ in the verify cycle. The latch-type sensing circuit operates to a subsequent re-program cycle in the above state. That is, in the subsequent program cycle, a potential of, for example, 10 volt is supplied to the bit line BL for the memory element in which writing is insufficient, and a potential of, for example, 0 volt is supplied to the bit line BL for the memory element in which writing is completed.

The latch-type sensing circuits explained in Examples 3 to 5 may be used in place of the latch-type sensing circuit explained in Example 6.

EXAMPLE 7

In Example 7, a read circuit is added to the program-verify circuit of the present invention explained in Example 2. The read circuit comprises an analog/digital converter (to be referred to as "A/D converter" hereinafter) composed of a neuron MOS transistor and the D/A converter explained in Example 2. The A/D converter is explained in detail in JP-A-7-200513.

Figure 20:
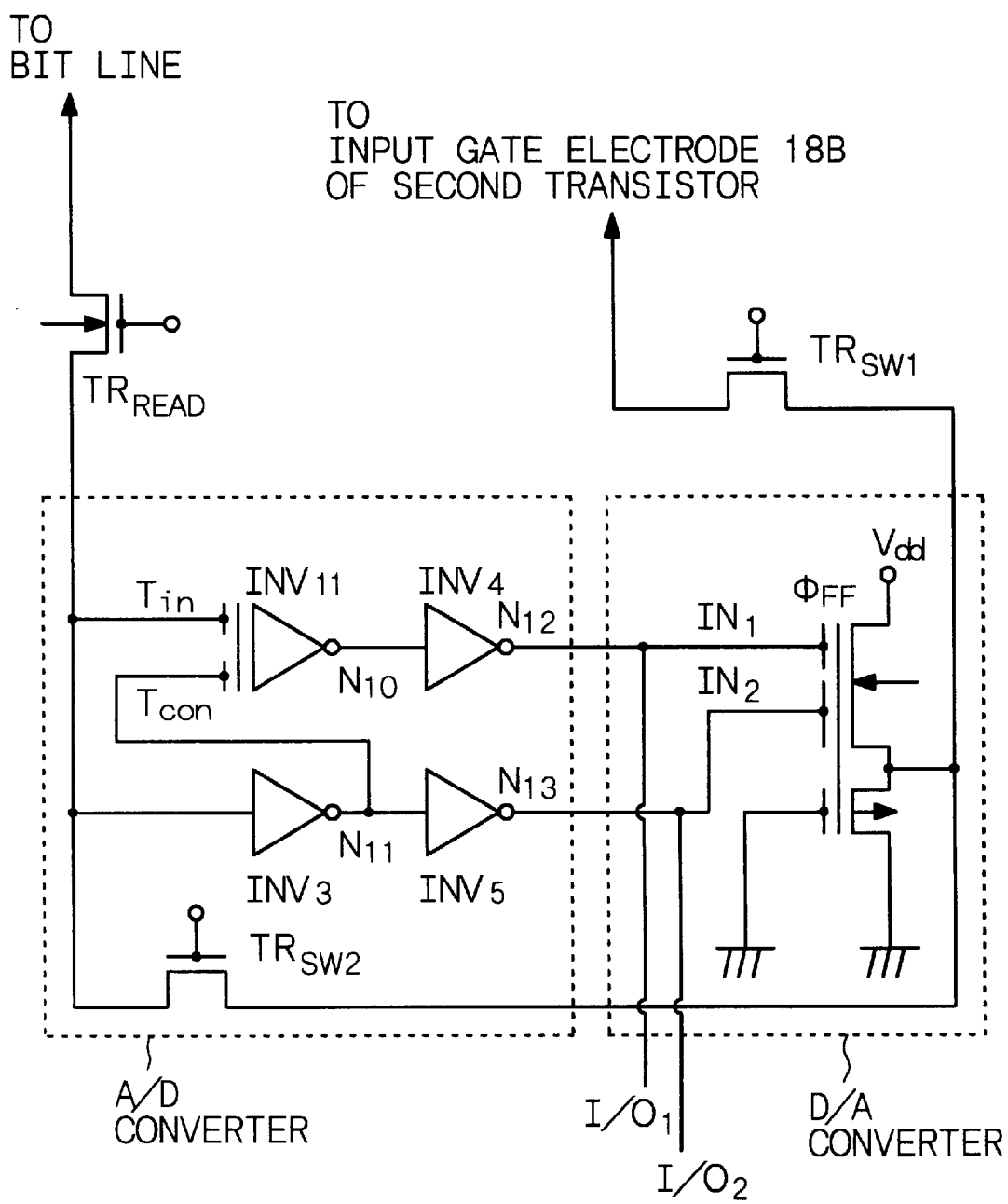
FIG. 20 shows a circuit diagram of a read circuit in a program-verify circuit in Example 7.
Figure 21A:
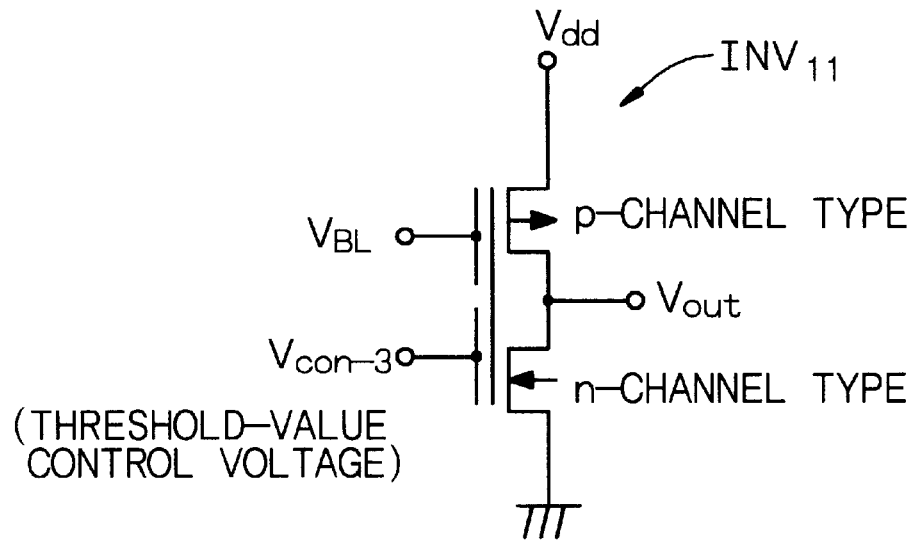
FIG. 21A shows a circuit diagram of a variable threshold voltage inverter.
Figure 21B:
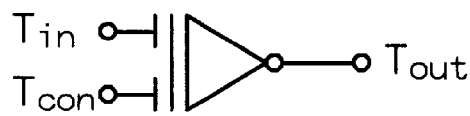
FIG. 21B is a skeleton diagram thereof.

The A/D converter whose circuit diagram is shown in FIG. 20 comprises a variable threshold voltage inverter $INV_{11}$, having two input portions ($T_{in}$ and $T_{con}$) and one output portion ($T_{out}$) shown in FIG. 21A, and a third inverter $INV_3$, a fourth inverter $INV_4$ and a fifth inverter $INV_5$ which are conventional CMOS inverters. FIG. 21B shows a skeleton diagram of the variable threshold voltage inverter $INV_{11}$. A bit line output potential $V_{BL}$ is inputted to one input portion $T_{in}$ of the variable threshold voltage inverter $INV_{11}$ and to an input portion of the third inverter $INV_3$. An output portion of the third inverter $INV_3$ is connected to the other input portion $T_{con}$ of the variable threshold voltage inverter $INV_{11}$ and an input portion of the fifth inverter $INV_5$. An output portion $T_{con}$ of the variable threshold voltage inverter $INV_{11}$ is connected to an input portion of the fourth inverter $INV_4$. Output portions of the fourth inverter $INV_4$ and the fifth inverter $INV_5$ are connected to two input gate electrodes $IN_1$ and $IN_2$ of the D/A converter composed of the neuron MOS transistor explained in Example 2, respectively. Input/output lines $I/O_1$ and $I/O_2$, which are common as the output lines of the A/D converter and the input lines of the D/A converter, are connected to output portions of the fourth inverter $INV_4$ and the fifth inverter $INV_5$. The output of the D/A converter is fed back to one input portion $T_{in}$ of the variable threshold voltage inverter $INV_{11}$ and the input portion of the third inverter $INV_3$. Further, the output portion of the D/A converter is connected to the input gate electrode 18B constituting the first inverter $INV_1$ of the latch-type sensing circuit.

Prior to explanations of the read circuit in Example 7, the variable threshold voltage inverter $INV_{11}$ having two input portions and being composed of a neuron MOS transistor shown in FIG. 21A will be outlined first.

The variable threshold voltage inverter $INV_{11}$ comprises a neuron CMOS transistor composed of a combination of a p-channel type transistor and an n-channel type transistor. A bit line output potential $V_{BL}$ is inputted to the input gate electrode of the p-channel type transistor. The input gate electrode corresponds to "one" input portion $T_{in}$ of the variable threshold voltage inverter $INV_{11}$. A threshold-value control voltage $V_{con-3}$ is inputted to the input gate electrode (threshold-voltage control gate electrode) of the n-channel type transistor. The input gate electrode corresponds to "the other" input portion $T_{con}$ of the variable threshold voltage inverter $INV_{11}$. The threshold-value control voltage $V_{con-3}$ is an output potential of the third inverter $INV_3$.

Figure 21C:
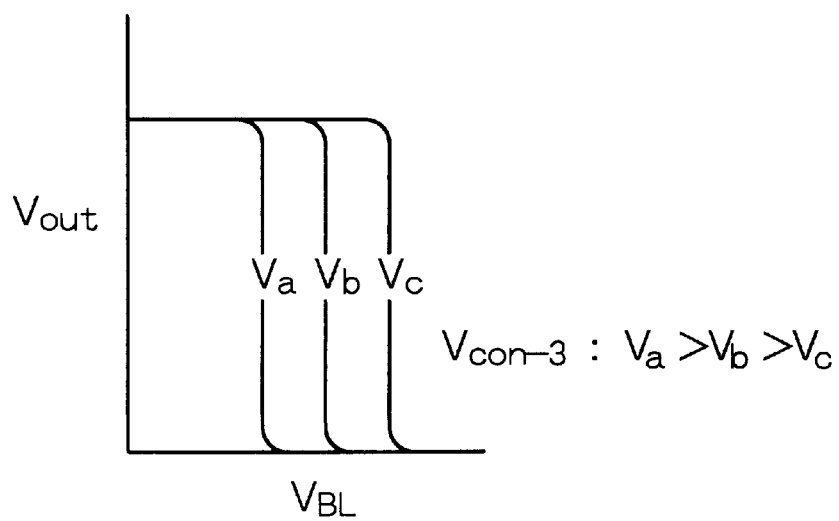
FIG. 21C shows output voltage characteristics thereof.

In the variable threshold voltage inverter $INV_{11}$, the threshold value of logical inversion can be set at an arbitrary voltage by changing the threshold-value control voltage $V_{con-3}$ to be inputted to the threshold-voltage control gate electrode. That is, the threshold value of logical inversion can be changed depending upon the output potential of the third inverter $INV_3$. FIG. 21C shows output voltage characteristics when the threshold-value control voltage $V_{con-3}$ is set at $V_a > V_b > V_c$. The higher the threshold-value control voltage $V_{coon-3}$ is, the lower the threshold value of logical inversion is. That is because a potential of a floating electrode of the neuron CMOS transistor increases with an increase in the threshold-value control voltage $V_{con-3}$.

The performance of the read circuit will be explained hereinafter. In the performance of readout, a first transistor for switching $TR_{SW1}$, a transistor for programming $TR_{PROG}$, and a transistor for verification $TR_{VERIFY}$ are turned off, and a transistor for reading $TR_{READ}$ and a second transistor for switching $TR_{SW2}$ are turned on. Current is flowed in the bit line BL, and the resultant bit line output potential $V_{BL}$ is inputted to one input portion $T_{in}$ of the variable threshold voltage inverter $INV_{11}$ and to the input portion of the third inverter $INV_3$. The third inverter $INV_3$ is pre-designed such that it outputs "H" when the bit line output potential $V_{BL}$ inputted thereinto is less than $(V_{BL-10}+V_{BL-01})/2$, and that it outputs "L" when the bit line output potential $V_{BL}$ inputted thereinto is equal to, or larger than, $(V_{BL-10}+V_{BL-01})/2$. That is, the third inverter $INV_3$ is pre-designed such that it outputs "H" when the bit line output potential $V_{BL}$ corresponds to data (0,0) and (0,1), and that it outputs "L" when the bit line output potential $V_{BL}$ corresponds to data (1,0) and (1,1).

Inversion takes place in the third inverter $INV_3$ depending upon the bit line output potential $V_{BL}$, and the output $V_{con-3}$ of the third inverter $INV_3$ is inputted to the other input portion $T_{con}$ (threshold-voltage control gate electrode) of the variable threshold voltage inverter $INV_{11}$, and to the input portion of the fifth inverter $INV_5$.

Figure 22A:
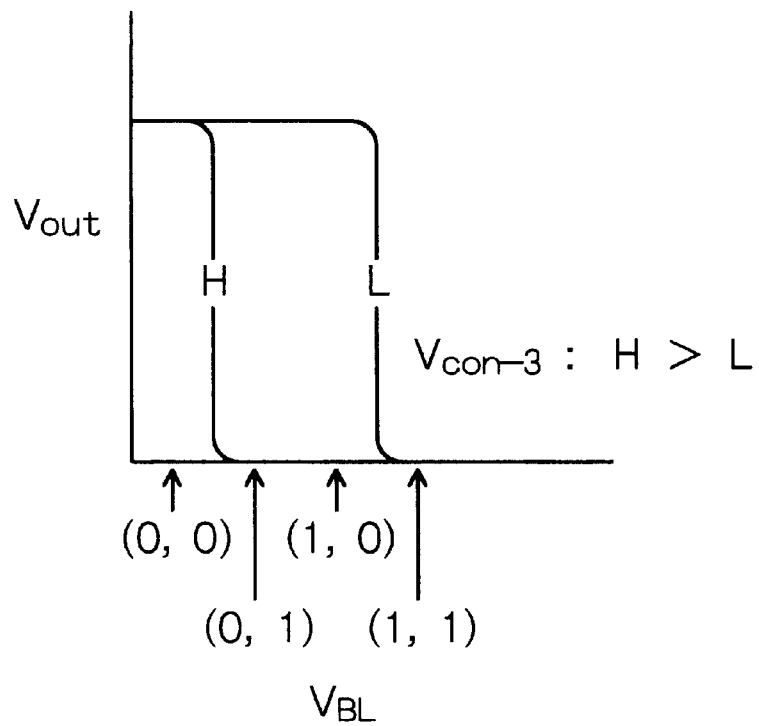
FIG. 22A schematically shows an inversion state in a variable threshold voltage inverter, and FIG. 22B schematically shows output potentials of a D/A converter combined with an A/D converter.

In the variable threshold voltage inverter $INV_{11}$, inversion takes place or does not take place depending upon the $V_{con-3}$ potential (which is "H" or "L" and is an output potential of the third inverter $INV_3$) inputted to the other input portion $T_{con}$ (threshold-voltage control gate electrode) and the bit line output potential $V_{BL}$ inputted to one input portion $T_{in}$, and the variable threshold voltage inverter $INV_{11}$ outputs a potential "H" or "L". FIG. 22A schematically shows the above state. In FIG. 22A, (1,1), (1,0), (0,1) and (0,0) on the axis of abscissas show the bit line output potentials $V_{BL}$ which appear in the bit line BL when data in the memory element is read out. Further, Table 5 shows a relationship of each of the nodes $N_{10}$, $N_{11}N_{12}$ and $N_{13}$ in FIG. 20 with the output potentials of the D/A converter.

TABLE 5

| Data corresponding to bit line output potential | Node | | | | D/A converter output |
|---|---|---|---|---|---|
| | $N_{11}$ | $N_{10}$ | $N_{12}$ | $N_{13}$ | |
| (1,1) | L | L | H | H | $(3/4)V_{dd}$ |
| (1,0) | L | H | L | H | $(2/4)V_{dd}$ |
| (0,1) | H | L | H | L | $(1/4)V_{dd}$ |
| (0,0) | H | H | L | L | $(0/4)V_{dd}$ |

Figure 22B:
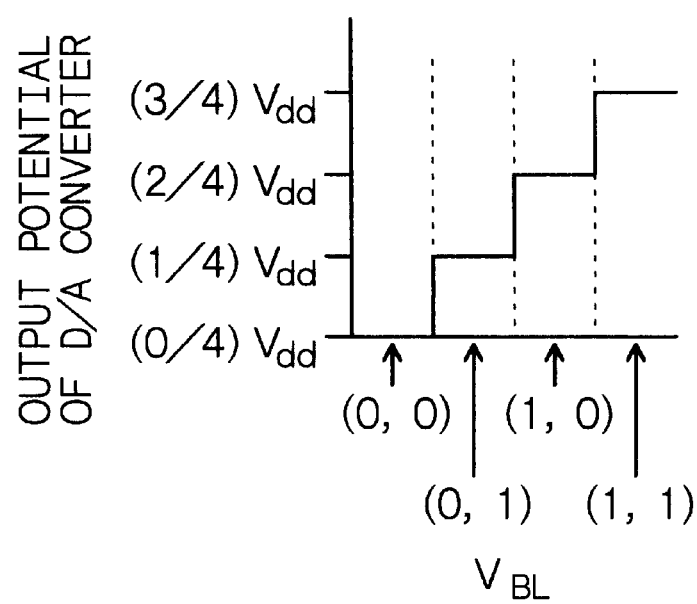
Figure 23:
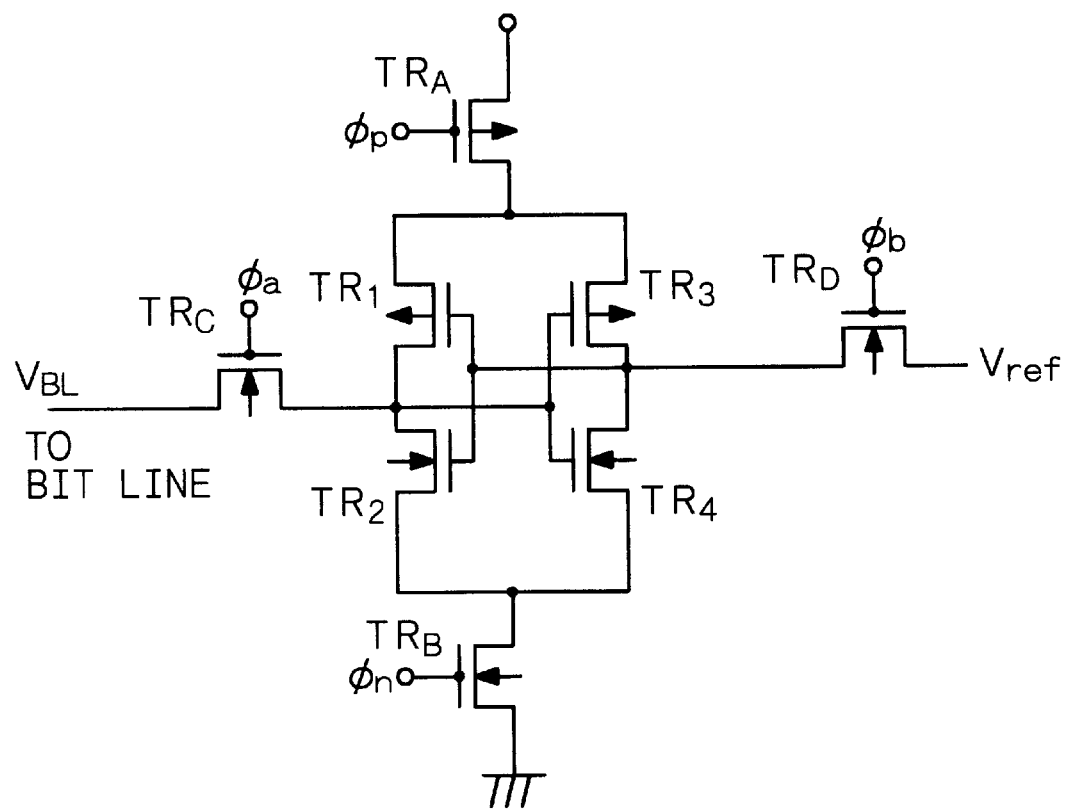
FIG. 23 is a circuit diagram of a conventional latch-type sensing circuit.

On the other hand, since the second transistor for switching $T_{SW2}$ is in an ON-state, the output of the D/A converter is fed back to one input portion $T_{in}$ of the variable threshold voltage inverter $INV_3$, and the input portion of the third inverter $INV_3$, whereby the outputs from the A/D converter to the output lines $I/O_1$ and $I/O_2$ are converted to binary data, and the output potential of the D/A converter converges on four discrete points depending upon the level of the inputted bit line output potential $V_{BL}$ as shown in FIG. 22B. Therefore, even if the bit line output potential $V_{BL}$ varies, it is normalized to the fixed potential of $(0/4)V_{dd}$, $(1/4)V_{dd}$, $(2/4)V_{dd}$ or $(3/4)V_{dd}$ so long as the bit line output potentials $V_{BL}$ corresponding to data do not overlap, and readout with a margin can be performed.

The program cycle and the verify cycle can be carried out in the same manner as in Example 2. In Example 7, the read circuit is combined with the program-verify circuit in the NAND type memory cell explained in Example 2, while the read circuit may be combined with the program-verify circuit in the NOR type memory cell explained in Example 6. In this case, in the read circuit shown in FIG. 20, the input/output lines $I/O_1$ and $I/O_2$ which are common as the output lines of the A/D converter and the input lines of the D/A converter can be connected to the output portion of the variable threshold voltage inverter $INV_{11}$ and the output portion of the third inverter $INV_3$, respectively. The read circuit explained in Example 7 can be applied to the program-verify circuits explained in Examples 3 to 5.

The present invention is explained with reference to preferred Examples hereinabove, while the present invention shall not be limited thereto. In Examples, explanations are given mostly with reference to embodiments in which 2 bits are stored in one memory element, while it is needless to say that the program-verify circuit of the present invention can be applied to an electrically re-writable memory cell for storing ternary or higher multi-valued data. Further, the latch-type sensing circuit of the present invention can not only applied to be the program-verify circuit but also applied to all of circuits required for comparing a potential $V_{in}$ inputted to the latch-type sensing circuit with a reference potential $V_{ref}$ converting the analog potential $V_{in}$ inputted to the latch-type sensing circuit to binary data (information that the inputted potential $V_{in}$ is higher or lower than the reference potential $V_{ref}$) on the basis of the reference potential $V_{ref}$ and retaining (latching) the binary data.

The inverter of which the threshold value of logical inversion is variable shall not be structurally limited to a so-called neuron CMOS transistor. The point is that the inverter can be a transistor having a plurality of input gate electrodes and having a configuration in which conduction and non-conduction can be controlled on the basis of "high" and "low" of a potential (threshold-value control voltage) inputted to part of the input gate electrodes. For example, the inverter of which the threshold value of logical inversion is variable can be composed of a so-called XMOS-type transistor in which input gate electrodes are formed so as to sandwich a channel-forming region (for example, formed above and below the channel-forming region). In this case, similarly, there may be employed an embodiment in which, for example, the reference potential $V_{ref}$ is inputted to one of the input gate electrodes and the threshold-value control voltage $V_{con}$ is inputted to the other input gate electrode.

The D/A converter can be omitted. When quaternary values are stored in the memory cell, there may be employed an embodiment in which, for example, three input portions (input gate electrodes) are formed for constituting the first inverter, two input gate electrodes (corresponding to "the other input gate electrodes") of these input gate electrodes are connected to the input lines $IN_1$ and $IN_2$.

When the latch-type sensing circuit of the present invention is used, it is no longer necessary to provide a plurality of latch-type sensing circuits or a plurality of reference potentials. Therefore, there can be overcome problems that the circuit layout area of memory cells increases and that the circuit is complicated, and further, that the performance of the memory cells are complicated. Further, since multi-valued data can be detected in a lump at once, the multi-valued method gives a readout speed which is hardly different from that of the binary method.

Furthermore, when an inverter of which the threshold value of logical inversion is variable is constituted of a so-called neuron cmos transistor, the inverter is substantially structurally the same as a memory cell, so that such inverter can be produced concurrently in the step of producing memory cells, which obviates an additional step of producing the memory cells.

What is claimed is:

1. A latch-type sensing circuit comprising a first inverter and a second inverter, at least said first inverter having a variable threshold value of logical inversion.

2. The latch-type sensing circuit of claim 1, wherein said first inverter has an input portion which is for receiving a reference potential and is connected to an output portion of the second inverter, and an input portion which is for receiving a potential for controlling a threshold value of logical inversion of the first inverter, and an output portion of the first inverter corresponding to an input/output terminal of the latch-type sensing circuit and is connected to an input portion of said second inverter.

3. The latch-type sensing circuit of claim 2, wherein said first inverter comprises a first and second transistor, said second transistor having a conductivity type opposite to a conductivity type of the first transistor, each of said first and second transistors being composed of;
(A) source/drain regions,
(B) a channel-forming region interposed between the source/drain regions, and
(C) a floating electrode formed above the channel-forming region through a first insulating layer, said first inverter further comprises a plurality of input gate electrodes formed above the floating electrode through a second insulating layer, said floating electrode of the first transistor and said floating electrode of the second transistor being of one common floating electrode, one of said input gate electrodes corresponding to said input portion which is for receiving the reference potential and is connected to the output portion of the second inverter, and another of said input gate electrodes corresponding to said input portion which is for receiving the potential for controlling the threshold value of logical inversion of said first inverter.

4. The latch-type sensing circuit of claim 3, wherein said second inverter has a fixed threshold value of logical inversion and comprises a third transistor and a fourth transistor having a conductivity type opposite to a conductivity type of the third transistor, each of said third transistor and the fourth transistor being composed of;
(A) source/drain regions,
(B) a channel-forming region interposed between the source/drain regions, and
(C) a floating electrode formed above the channel-forming region through a first insulating layer, said second inverter further has a plurality of input gate electrodes formed above the floating electrode through a second insulating layer, said floating electrode of the third transistor and said floating electrode of the fourth transistor are of one common floating electrode, a plurality of said input gate electrodes are common, and said common input gate electrode corresponds to the input portion of said second inverter.

5. The latch-type sensing circuit of claim 3, wherein said second inverter has a fixed threshold value of logical inversion and is composed of CMOS.

6. The latch-type sensing circuit of claim 3, wherein said second inverter has a variable threshold value of logical inversion and comprises a third transistor and a fourth transistor having a conductivity type opposite to a conductivity type of said third transistor, each of said third and fourth transistor is composed of;
(A) source/drain regions,
(B) a channel-forming region interposed between the source/drain regions, and
(C) a floating electrode formed above the channel-forming region through a first insulating layer, said second inverter further has a plurality of input gate electrodes formed above the floating electrode through a second insulating layer, said floating electrode of the third transistor and said floating electrode of the fourth transistor are of one common floating electrode, one of said input gate electrodes corresponds to the input portion of the second inverter, and another of said other input gate electrodes is for receiving a potential for controlling a threshold value of logical inversion of said second inverter.

7. The latch-type sensing circuit of claim 1, wherein said first inverter has an input portion which corresponds to an input/output terminal of the latch-type sensing circuit and is connected to an output portion of said second inverter, and an input portion which is for receiving a potential for controlling a threshold value of logical inversion of said first inverter, and an input portion of said second inverter is for receiving a reference potential and is connected to an output portion of said first inverter.

8. The latch-type sensing circuit of claim 7, wherein said first inverter comprises a first and second transistor, said second transistor having a conductivity type opposite to a conductivity type of the first transistor each of the first transistor and the second transistor is composed of;
(A) source/drain regions,
(B) a channel-forming region interposed between the source/drain regions, and
(C) a floating electrode formed above the channel-forming region through a first insulating layer, said first inverter further has a plurality of input gate electrodes formed above the floating electrode through a second insulating layer, the floating electrode of the first transistor and said floating electrode of the second transistor are of one common floating electrode, one input gate electrode corresponds to said input portion which corresponds to the input/output terminal of the latch-type sensing circuit and is connected to the output portion of the second inverter, and the other input gate electrode corresponds to said input portion which is for receiving the potential for controlling the threshold value of logical inversion of the first inverter.

9. The latch-type sensing circuit of claim 8, wherein the second inverter has a fixed threshold value of logical inversion and comprises a third transistor, and a fourth transistor having a conductivity type opposite to a conductivity type of the third transistor, each of said third and fourth transistors being composed of;
(A) source/drain regions,
(B) a channel-forming region interposed between said source/drain regions, and
(C) a floating electrode formed above the channel-forming region through a first insulating layer,
the second inverter further has a plurality of input gate electrodes formed above the floating electrode through a second insulating layer,
the floating electrode of said third transistor and the floating electrode of said fourth transistor are of one common floating electrode,
a plurality of the input gate electrodes are common, and the common input gate electrode corresponds to the input portion of the second inverter.

10. The latch-type sensing circuit of claim 8, wherein the second inverter has a fixed threshold value of logical inversion and is composed of CMOSs.

11. A program-verify circuit for an electrically re-writable memory cell for storing a ternary or higher multi-valued data, said memory cell comprising a floating gate and a control gate, said program-verify circuit having a latch-type sensing circuit,
the latch-type sensing circuit comprising a first inverter and a second inverter, at least the first inverter having a variable threshold value of logical inversion, the latch-type sensing circuit having an input/output terminal connected to the memory cell through a bit line.

12. The program-verify circuit of claim 11, wherein said first inverter has an input portion which is for receiving a reference potential and is connected to an output portion of the second inverter, and an input portion which is for receiving a potential for controlling a threshold value of logical inversion of said first inverter, an output portion of said first inverter corresponding to the input/output terminal of the latch-type sensing circuit and is connected to an input portion of said second inverter.

13. The program-verify circuit of claim 12, wherein the first inverter comprises a first and second transistor, said second transisitor having a conductivity type opposite to a conductivity type of the first transistor, each of said first and second transistors being composed of;
(A) source/drain regions,
(B) a channel-forming region interposed between the source/drain regions, and
(C) a floating electrode formed above the channel-forming region through a first insulating layer,
said first inverter further has a plurality of input gate electrodes formed above the floating electrode through a second insulating layer,
said floating electrode of the first transistor and said floating electrode of said second transistor are of one common floating electrode, one input gate electrode corresponds to said input portion which is for receiving the reference potential and is connected to the output portion of the second inverter, and
another of said input gate electrodes corresponds to said input portion which is for receiving the potential for controlling the threshold value of logical inversion of said first inverter.

14. The program-verify circuit of claim 13, wherein said second inverter has a fixed threshold value of logical inversion and comprises a third and fourth transistor, said fourth transistor having a conductivity type opposite to a conductivity type of the said transistor, each of said third and fourth transistors being composed of;
(A) source/drain regions,
(B) a channel-forming region interposed between said source/drain regions, and
(C) a floating electrode formed above said channel-forming region through a first insulating layer,
the second inverter further has a plurality of input gate electrodes formed above the floating electrode through a second insulating layer,
the floating electrode of said third transistor and the floating electrode of said fourth transistor are of one common floating electrode,
a plurality of the input gate electrodes are common, and the common input gate electrode corresponds to the input portion of the second inverter.

15. The program-verify circuit of claim 13, wherein said second inverter has a fixed threshold value of logical inversion and is composed of CMOSs.

16. The program-verify circuit of claim 13, wherein said second inverter has a variable threshold value of logical inversion and comprises a third and fourth transistor, said third transistor having a conductivity type opposite to a conductivity type of the third transistor, each of said third and fourth transistors being composed of;
(A) source/drain regions,
(B) a channel-forming region interposed between said source/drain regions, and
(C) a floating electrode formed above the channel-forming region through a first insulating layer,
said second inverter further has a plurality of input gate electrodes formed above the floating electrode through a second insulating layer,
the floating electrode of said third transistor and the floating electrode of said fourth transistor are of one common floating electrode,
one of the input gate electrodes corresponds to the input portion of said second inverter, and
another input gate being for receiving the potential for controlling a threshold value of logical inversion of the second inverter.

17. The program-verify circuit of claim 13, wherein the program-verify circuit further has a digital/analog converter for outputting the potential for controlling the threshold value of logical inversion of said first inverter.

18. The program-verify circuit of claim 17, wherein said digital/analog converter comprises a variable threshold voltage field-effect transistor, said variable threshold voltage field-effect transistor is composed of;
(a) source/drain regions,
(b) a channel-forming region interposed between the source/drain regions, (c) one floating electrode formed above the channel-forming region through a first insulating layer, and
(d) a plurality of input gate electrodes which are formed above the floating electrode through a second insulating layer and are for receiving signals corresponding to multi-valued data to be stored, and
one of the source/drain regions outputs the potential for controlling the threshold value of logical inversion of said first inverter.

19. The program-verify circuit of claim 18, wherein said program-verify circuit further has a read circuit comprising an analog/digital converter, said digital/analog converter being composed of said variable threshold voltage field-effect transistor,
an input portion of the analog/digital converter being connected to the bit line, each of the output portions of the analog/digital converter is connected to each of the input gate electrodes of the variable threshold voltage field-effect transistor constituting the digital/analog converter, and
one of the source/drain regions of said variable threshold voltage field-effect transistor constituting said digital/analog converter is also connected to the input portion of said analog/digital converter.

20. The program-verify circuit of claim 19, wherein said variable threshold voltage field-effect transistor constituting the digital/analog converter has two input gate electrodes,
said analog/digital converter is composed of a variable threshold voltage inverter having two input portions and one output portion and third, fourth and fifth inverters, each comprising CMOS inverters,
one input portion of the variable threshold voltage inverter and an input portion of the third inverter are connected to the bit line,
an output portion of the third inverter is connected to the other input portion of the variable threshold voltage inverter and an input portion of the fifth inverter,
an output portion of the variable threshold voltage inverter is connected to an input portion of the fourth inverter, and
output portions of the fourth inverter and the fifth inverter are connected to two input gate electrodes of said digital/analog converter.

21. The program-verify circuit of claim 11, wherein said first inverter has an input portion which corresponds to the input/output terminal of the latch-type sensing circuit and is connected to an output portion of the second inverter, and an input portion which is for receiving a potential for controlling a threshold value of logical inversion of the first inverter, and
an input portion of said second inverter, connected to an output portion of said first inverter for receiving a reference potential.

22. The program-verify circuit of claim 21, wherein said first inverter comprises a first and second transistor, said second transistor having a conductivity type opposite to a conductivity type of the first transistor,
each of said first and second transistors comprising;
(A) source/drain regions,
(B) a channel-forming region interposed between the source/drain regions, and
(C) a floating electrode formed above the channel-forming region through a first insulating layer,
said first inverter further comprising a plurality of input gate electrodes formed above the floating electrode through a second insulating layer,
the floating electrode of said first transistor and the floating electrode of said second transistor are of one common floating electrode,
one input gate electrode corresponding to said input portion, which corresponds to the input/output terminal of the latch-type sensing circuit and is connected to the output portion of the second inverter, and
the other input gate electrode corresponds to said input portion which is for receiving the potential for controlling the threshold value of logical inversion of said first inverter.

23. The program-verify circuit of claim 22, wherein the second inverter has a fixed threshold value of logical inversion and comprises a third transistor and a fourth transistor having a conductivity type opposite to a conductivity type of the third transistor,
each of the third transistor and the fourth transistor comprising;
(A) source/drain regions,
(B) a channel-forming region interposed between the source/drain regions, and
(C) a floating electrode formed above the channel-forming region through a first insulating layer,
the second inverter further has a plurality of input gate electrodes formed above the floating electrode through a second insulating layer,
the floating electrode of said third transistor and the floating electrode of said fourth transistor are of one common floating electrode,
a plurality of the input gate electrodes are common, and the common input gate electrode corresponds to [the] said input portion of said second inverter.

24. The program-verify circuit of claim 22, wherein the second inverter has a fixed threshold value of logical inversion and is composed of CMOSs.

25. The program-verify circuit of claim 22, wherein said program-verify circuit further has a digital/analog converter for outputting the potential for controlling the threshold value of logical inversion of said first inverter.

26. The program-verify circuit of claim 25, wherein the digital/analog converter comprises a variable threshold voltage field-effect transistor, the variable threshold voltage field-effect transistor comprising;
(a) a plurality of source/drain regions,
(b) a channel-forming region interposed between the source/drain regions,
(c) one floating electrode formed above the channel-forming region through a first insulating layer, and
(d) a plurality of input gate electrodes which are formed above the floating electrode through a second insulating layer and are for receiving signals corresponding to multi-valued data to be stored, and
one of said source/drain regions outputs the potential for controlling the threshold value of logical inversion of said first inverter.

27. The program-verify circuit of claim 26, wherein the program-verify circuit further has a read circuit comprising an analog/digital converter and said digital/analog converter composed of said variable threshold voltage field-effect transistor,
an input portion of said analog/digital converter is connected to the bit line, each of the output portions of the analog/digital converter is connected to each of the input gate electrodes of the variable threshold voltage field-effect transistor constituting the digital/analog converter, and one of said source/drain regions of the variable threshold voltage field-effect transistor constituting the digital/analog converter is also connected to the input portion of said analog/digital converter.

28. The program-verify circuit of claim 27, wherein the variable threshold voltage field-effect transistor constituting the digital/analog converter has two input gate electrodes, the analog/digital converter is composed of a variable threshold voltage inverter having two input portions and one output portion and third, fourth and fifth inverters comprising CMOS inverters each, one input portion of the variable threshold voltage inverter and an input portion of the third inverter are connected to the bit line, an output portion of the third inverter is connected to the other input portion of the variable threshold voltage inverter and an input portion of the fifth inverter, an output portion of the variable threshold voltage inverter is connected to an input portion of the fourth inverter, and output portions of the fourth inverter and the fifth inverter are connected to two input gate electrodes of the digital/analog converter.

29. The program-verify circuit of claim 11, wherein said memory cell is a NOR type nonvolatile semiconductor memory cell.

30. The program-verify circuit of claim 11, wherein said memory cell is a NAND type nonvolatile semiconductor memory cell.

* * * * *